(12) United States Patent
Yamazaki et al.

(10) Patent No.: US 11,791,350 B2
(45) Date of Patent: Oct. 17, 2023

(54) PEELING METHOD AND MANUFACTURING METHOD OF FLEXIBLE DEVICE

(71) Applicant: Semiconductor Energy Laboratory Co., Ltd., Atsugi (JP)

(72) Inventors: Shunpei Yamazaki, Setagaya (JP); Yasuharu Hosaka, Tochigi (JP); Satoru Idojiri, Tochigi (JP); Kenichi Okazaki, Tochigi (JP); Hiroki Adachi, Tochigi (JP); Daisuke Kubota, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/701,961

(22) Filed: Mar. 23, 2022

(65) Prior Publication Data

US 2022/0216243 A1 Jul. 7, 2022

Related U.S. Application Data

(63) Continuation of application No. 16/884,241, filed on May 27, 2020, now Pat. No. 11,296,132, which is a
(Continued)

(30) Foreign Application Priority Data

Apr. 7, 2016 (JP) .................................. 2016-077667
Apr. 7, 2016 (JP) .................................. 2016-077668

(51) Int. Cl.
*H01L 51/52* (2006.01)
*H01L 27/12* (2006.01)
(Continued)

(52) U.S. Cl.
CPC ...... *H01L 27/1266* (2013.01); *H01L 21/6835* (2013.01); *H01L 27/1218* (2013.01);
(Continued)

(58) Field of Classification Search
None
See application file for complete search history.

(56) References Cited

U.S. PATENT DOCUMENTS 6,127,199 A 10/2000 Inoue et al.
6,372,608 B1 4/2002 Shimoda et al.
(Continued)

FOREIGN PATENT DOCUMENTS

CN 101432661 A 5/2009
CN 101728420 A 6/2010
(Continued)

OTHER PUBLICATIONS

Office Action (U.S. Appl. No. 15/596,412) dated Jan. 25, 2018.
Chinese Office Action (Application No. 201710206457.1) dated Feb. 11, 2022.

*Primary Examiner* — Benjamin P Sandvik
(74) *Attorney, Agent, or Firm* — ROBINSON INTELLECTUAL PROPERTY LAW OFFICE; Eric J. Robinson

(57) ABSTRACT

A peeling method at low cost with high mass productivity is provided. A resin layer having a thickness greater than or equal to 0.1 μm and less than or equal to 3 μm is formed over a formation substrate using a photosensitive and thermosetting material, a transistor including an oxide semiconductor in a channel formation region is formed over the resin layer, the resin layer is irradiated with light using a linear laser device, and the transistor and the formation substrate are separated from each other. A first region and a second region which is thinner than the first region or an opening can be formed in the resin layer. In the case of forming a conductive layer functioning as an external connection terminal or the like to overlap with the second region or the opening of the resin layer, the conductive layer is exposed.

6 Claims, 27 Drawing Sheets

Related U.S. Application Data continuation of application No. 15/473,962, filed on Mar. 30, 2017, now Pat. No. 10,680,020.

(51) Int. Cl.
  *H01L 21/683* (2006.01)
  *H01L 29/66* (2006.01)
  *H01L 29/786* (2006.01)
  *H10K 59/121* (2023.01)

(52) U.S. Cl.
  CPC .... *H01L 27/1225* (2013.01); *H01L 29/66969* (2013.01); *H01L 29/7869* (2013.01); *H01L 29/78603* (2013.01); *H01L 29/78648* (2013.01); *H01L 2221/6835* (2013.01); *H01L 2221/68386* (2013.01); *H10K 59/1213* (2023.02)

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,700,631 B1 | 3/2004 | Inoue et al. |
| 6,818,530 B2 | 11/2004 | Shimoda et al. |
| 6,849,877 B2 | 2/2005 | Yamazaki et al. |
| 7,094,665 B2 | 8/2006 | Shimoda et al. |
| 7,211,828 B2 | 5/2007 | Yamazaki et al. |
| 7,285,476 B2 | 10/2007 | Shimoda et al. |
| 7,420,208 B2 | 9/2008 | Yamazaki et al. |
| RE40,601 E | 12/2008 | Inoue et al. |
| 7,468,308 B2 | 12/2008 | Shimoda et al. |
| 7,591,863 B2 | 9/2009 | Watanabe et al. |
| 7,728,326 B2 | 6/2010 | Yamazaki et al. |
| 7,785,938 B2 | 8/2010 | Yamaguchi et al. |
| 7,791,072 B2 | 9/2010 | Kumomi et al. |
| 7,833,871 B2 | 11/2010 | Kawakami et al. |
| 7,952,101 B2 | 5/2011 | Yamazaki et al. |
| 7,994,617 B2 | 8/2011 | Arai et al. |
| 8,043,936 B2 | 10/2011 | Eguchi et al. |
| 8,048,770 B2 | 11/2011 | Eguchi et al. |
| 8,048,777 B2 | 11/2011 | Eguchi et al. |
| 8,120,159 B2 | 2/2012 | Yamaguchi et al. |
| 8,123,896 B2 | 2/2012 | Watanabe et al. |
| 8,134,149 B2 | 3/2012 | Yamazaki et al. |
| 8,188,474 B2 | 5/2012 | Hatano et al. |
| 8,222,666 B2 * | 7/2012 | Hatano ............... H01L 29/24 257/E33.053 |
| 8,237,166 B2 | 8/2012 | Kumomi et al. |
| 8,274,079 B2 | 9/2012 | Yamazaki |
| 8,288,856 B2 | 10/2012 | Yamaguchi et al. |
| 8,299,553 B2 | 10/2012 | Kawakami et al. |
| 8,367,440 B2 | 2/2013 | Takayama et al. |
| 8,415,208 B2 | 4/2013 | Takayama et al. |
| 8,415,660 B2 | 4/2013 | Yamazaki et al. |
| 8,450,769 B2 | 5/2013 | Hatano et al. |
| 8,575,740 B2 | 11/2013 | Arai et al. |
| 8,581,265 B2 | 11/2013 | Hatano et al. |
| 8,629,522 B2 | 1/2014 | Kawakami et al. |
| 8,674,354 B2 | 3/2014 | Yamazaki |
| 8,698,156 B2 | 4/2014 | Watanabe et al. |
| 8,766,314 B2 | 7/2014 | Hatano et al. |
| 8,822,982 B2 | 9/2014 | Yamazaki et al. |
| 8,878,180 B2 | 11/2014 | Yamazaki |
| 9,088,006 B2 | 7/2015 | Yamazaki et al. |
| 9,117,976 B2 | 8/2015 | Hatano et al. |
| 9,130,048 B2 | 9/2015 | Yamazaki et al. |
| 9,166,180 B2 | 10/2015 | Yamazaki et al. |
| 9,178,168 B2 | 11/2015 | Yamazaki et al. |
| 9,196,739 B2 | 11/2015 | Yamazaki |
| 9,202,923 B2 | 12/2015 | Yamazaki |
| 9,276,224 B2 | 3/2016 | Yamazaki et al. |
| 9,401,458 B2 | 7/2016 | Hatano et al. |
| 9,425,371 B2 | 8/2016 | Hatano et al. |
| 9,427,948 B2 | 8/2016 | Moriceau et al. |
| 9,437,831 B2 | 9/2016 | Yamazaki et al. |
| 9,466,728 B2 | 10/2016 | Yamazaki et al. |
| 9,559,316 B2 | 1/2017 | Yamazaki et al. |
| 9,559,317 B2 | 1/2017 | Yamazaki et al. |
| 9,627,648 B2 | 4/2017 | Yamazaki et al. |
| 9,728,555 B2 | 8/2017 | Yamazaki |
| 9,793,329 B2 | 10/2017 | Hatano et al. |
| 9,799,716 B2 | 10/2017 | Hatano et al. |
| 9,887,392 B2 | 2/2018 | Sakuishi et al. |
| 9,899,626 B2 | 2/2018 | Nakada et al. |
| 9,954,115 B2 | 4/2018 | Yamazaki et al. |
| 9,991,288 B2 | 6/2018 | Yamazaki |
| 10,007,133 B2 | 6/2018 | Yamazaki et al. |
| 10,038,171 B2 | 7/2018 | Sakuishi et al. |
| 10,170,600 B2 | 1/2019 | Jinbo |
| 10,269,979 B2 | 4/2019 | Yamazaki et al. |
| 10,312,315 B2 | 6/2019 | Yamazaki et al. |
| 10,340,319 B2 | 7/2019 | Hatano et al. |
| 10,355,067 B2 | 7/2019 | Yamazaki et al. |
| 10,401,662 B2 | 9/2019 | Yamazaki et al. |
| 10,615,179 B2 | 4/2020 | Yamazaki |
| 10,658,517 B2 | 5/2020 | Yamazaki et al. |
| 10,763,322 B2 | 9/2020 | Yamazaki et al. |
| 10,804,487 B2 | 10/2020 | Nakada et al. |
| 10,854,697 B2 | 12/2020 | Yamazaki et al. |
| 10,872,947 B2 | 12/2020 | Yamazaki et al. |
| 10,879,331 B2 | 12/2020 | Yamazaki et al. |
| 11,004,925 B2 | 5/2021 | Yamazaki et al. |
| 11,101,295 B2 | 8/2021 | Yamazaki |
| 11,189,676 B2 | 11/2021 | Hatano et al. |
| 2003/0047280 A1 | 3/2003 | Takayama et al. |
| 2003/0227038 A1 | 12/2003 | Kikuchi et al. |
| 2004/0245924 A1 | 12/2004 | Utsunomiya et al. |
| 2005/0054178 A1 | 3/2005 | Utsunomiya |
| 2005/0127371 A1 | 6/2005 | Yamazaki et al. |
| 2007/0298589 A1 | 12/2007 | Nishihata et al. |
| 2008/0042168 A1 | 2/2008 | Watanabe et al. |
| 2009/0023251 A1 | 1/2009 | Eguchi et al. |
| 2010/0253607 A1 | 10/2010 | Shiozaki |
| 2011/0284974 A1 | 11/2011 | Arai et al. |
| 2011/0294244 A1 | 12/2011 | Hattori et al. |
| 2012/0045861 A1 | 2/2012 | Eguchi et al. |
| 2012/0077345 A1 | 3/2012 | Saito et al. |
| 2012/0187399 A1 | 7/2012 | Fukuda et al. |
| 2013/0126860 A1 | 5/2013 | Fukuda et al. |
| 2013/0156989 A1 | 6/2013 | Moriceau et al. |
| 2013/0181204 A1 | 7/2013 | Kuranaga et al. |
| 2013/0187162 A1 | 7/2013 | Miwa |
| 2013/0214324 A1 | 8/2013 | Takayama et al. |
| 2013/0265530 A1 | 10/2013 | Fukushima et al. |
| 2014/0104508 A1 | 4/2014 | Yamazaki et al. |
| 2014/0113440 A1 | 4/2014 | Tanaka et al. |
| 2014/0117342 A1 * | 5/2014 | Kwon ............... H01L 51/5253 257/40 |
| 2014/0190621 A1 | 7/2014 | Kawata et al. |
| 2014/0213071 A1 | 7/2014 | Kawakami et al. |
| 2014/0220745 A1 | 8/2014 | Watanabe et al. |
| 2014/0234664 A1 | 8/2014 | Yasumoto et al. |
| 2014/0273317 A1 | 9/2014 | Chida |
| 2014/0326974 A1 | 11/2014 | Yamazaki et al. |
| 2014/0339527 A1 | 11/2014 | Lee et al. |
| 2014/0339528 A1 | 11/2014 | Yamazaki et al. |
| 2015/0076662 A1 | 3/2015 | Aida et al. |
| 2015/0155505 A1 | 6/2015 | Yamazaki et al. |
| 2015/0187849 A1 | 7/2015 | Kachatryan et al. |
| 2015/0187878 A1 | 7/2015 | Yamazaki et al. |
| 2015/0250038 A1 | 9/2015 | Sakuishi et al. |
| 2015/0279870 A1 | 10/2015 | Jiang |
| 2015/0280172 A1 | 10/2015 | Nishinohara et al. |
| 2015/0349136 A1 | 12/2015 | Koo et al. |
| 2015/0379923 A1 | 12/2015 | Lee et al. |
| 2016/0056217 A1 | 2/2016 | Yu et al. |
| 2017/0133450 A1 | 5/2017 | Yamazaki et al. |
| 2017/0330903 A1 | 11/2017 | Chida et al. |
| 2017/0338250 A1 | 11/2017 | Yanaka et al. |
| 2018/0166524 A1 | 6/2018 | Yamazaki et al. |
| 2021/0028392 A1 | 1/2021 | Nakada et al. |

(56) References Cited

U.S. PATENT DOCUMENTS

| | | |
|---|---|---|
| 2021/0210520 A1 | 7/2021 | Yamazaki |
| 2021/0257432 A1 | 8/2021 | Yamazaki et al. |

FOREIGN PATENT DOCUMENTS

| | | |
|---|---|---|
| CN | 102169850 A | 8/2011 |
| CN | 103728757 A | 4/2014 |
| CN | 104882404 A | 9/2015 |
| EP | 0532314 A | 3/1993 |
| EP | 0858110 A | 8/1998 |
| EP | 1351308 A | 10/2003 |
| EP | 1655633 A | 5/2006 |
| EP | 1744365 A | 1/2007 |
| EP | 1758169 A | 2/2007 |
| EP | 2178133 A | 4/2010 |
| FR | 2984597 | 6/2013 |
| JP | 05-175506 A | 7/1993 |
| JP | 08-330295 A | 12/1996 |
| JP | 10-206896 A | 8/1998 |
| JP | 11-074533 A | 3/1999 |
| JP | 2003-100450 A | 4/2003 |
| JP | 2005-085705 A | 3/2005 |
| JP | 2005-252243 A | 9/2005 |
| JP | 2006-287068 A | 10/2006 |
| JP | 2007-269922 A | 10/2007 |
| JP | 2009-260166 A | 11/2009 |
| JP | 2010-073733 A | 4/2010 |
| JP | 2010-212489 A | 9/2010 |
| JP | 2011-181913 A | 9/2011 |
| JP | 2011-248072 A | 12/2011 |
| JP | 2012-059860 A | 3/2012 |
| JP | 2014-022459 A | 2/2014 |
| JP | 2014-197522 A | 10/2014 |
| JP | 2015-072361 A | 4/2015 |
| JP | 2015-187701 A | 10/2015 |
| JP | 2016-034027 A | 3/2016 |
| JP | 2016-048792 A | 4/2016 |
| JP | 2016-189004 A | 11/2016 |
| KR | 2011-0106370 A | 9/2011 |
| KR | 2015-0077969 A | 7/2015 |
| KR | 2015-0138912 A | 12/2015 |
| TW | 201539826 | 10/2015 |
| WO | WO-2005/076359 | 8/2005 |
| WO | WO-2007/125992 | 11/2007 |
| WO | WO-2010/071089 | 6/2010 |
| WO | WO-2011/096263 | 8/2011 |
| WO | WO-2015/083029 | 6/2015 |
| WO | WO-2015/132698 | 9/2015 |

* cited by examiner

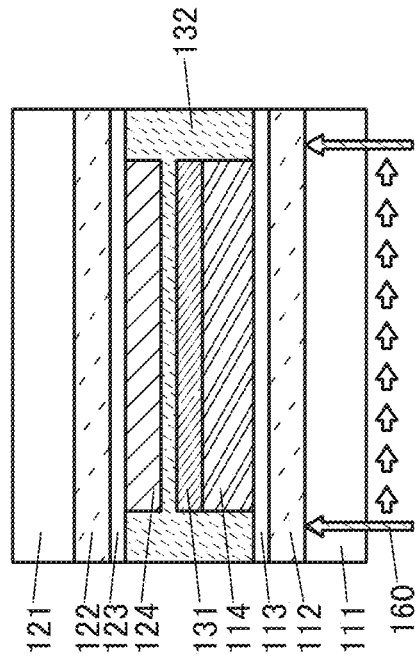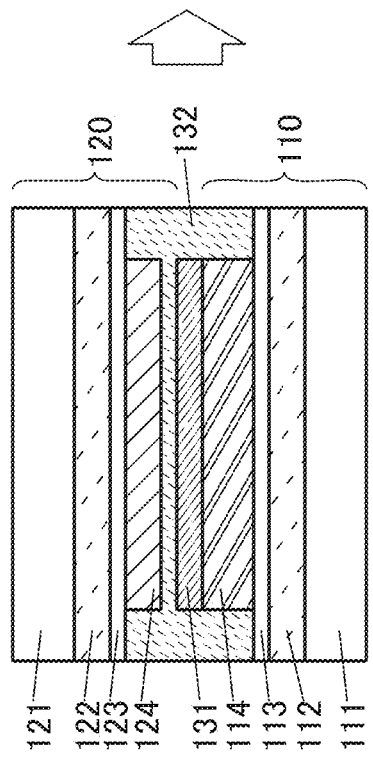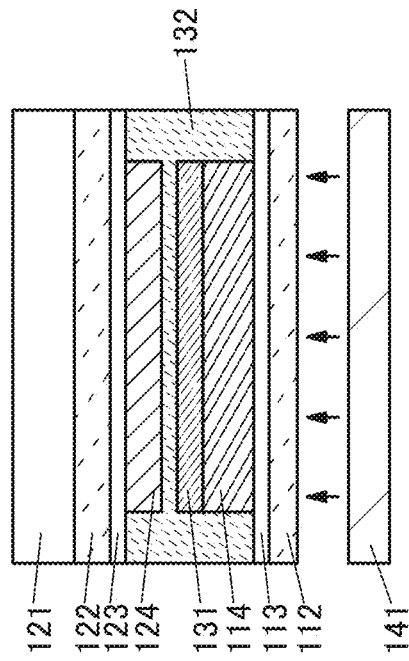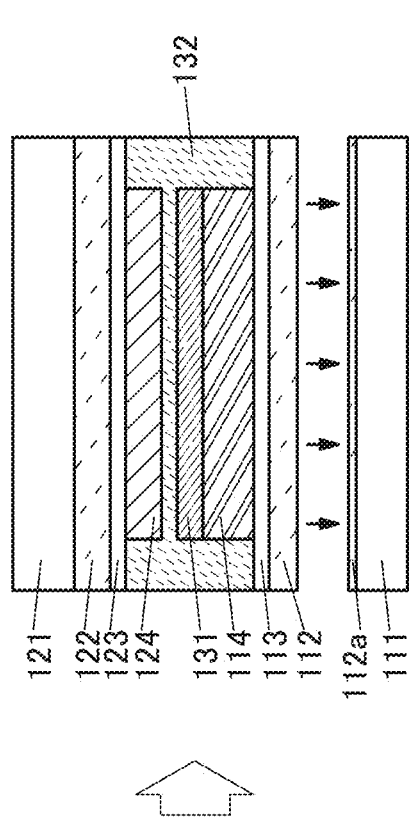

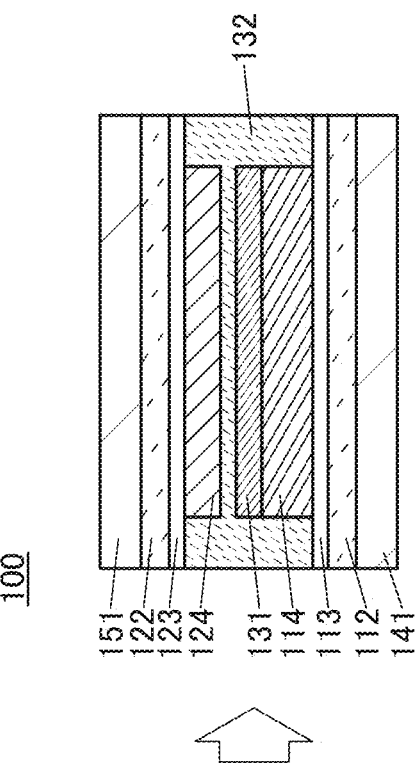
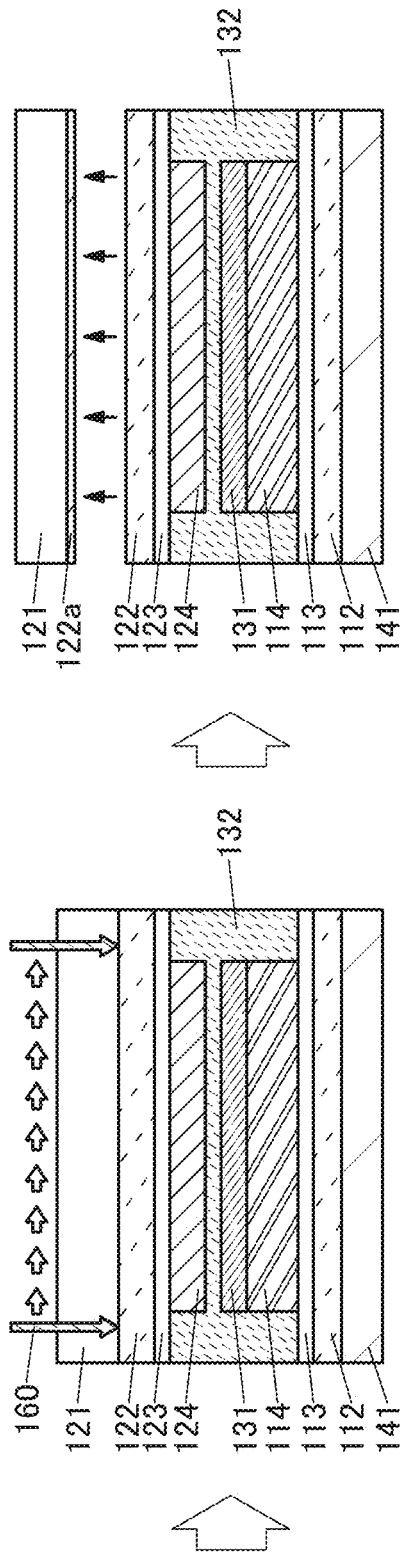
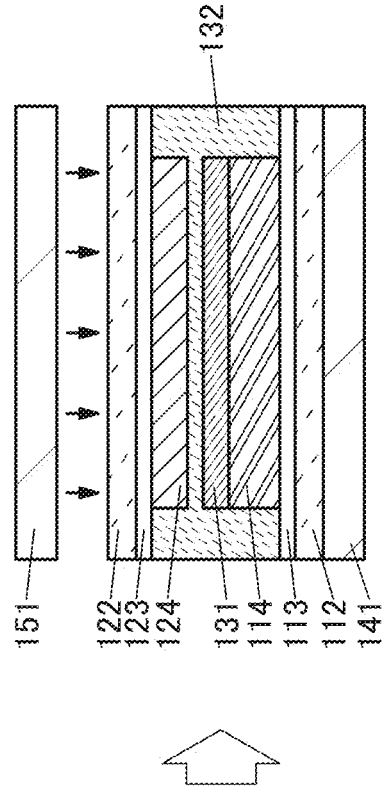

A1, A2, A3

B1, B2, B3

C1, C2, C3

FIG. 27A Before peeling
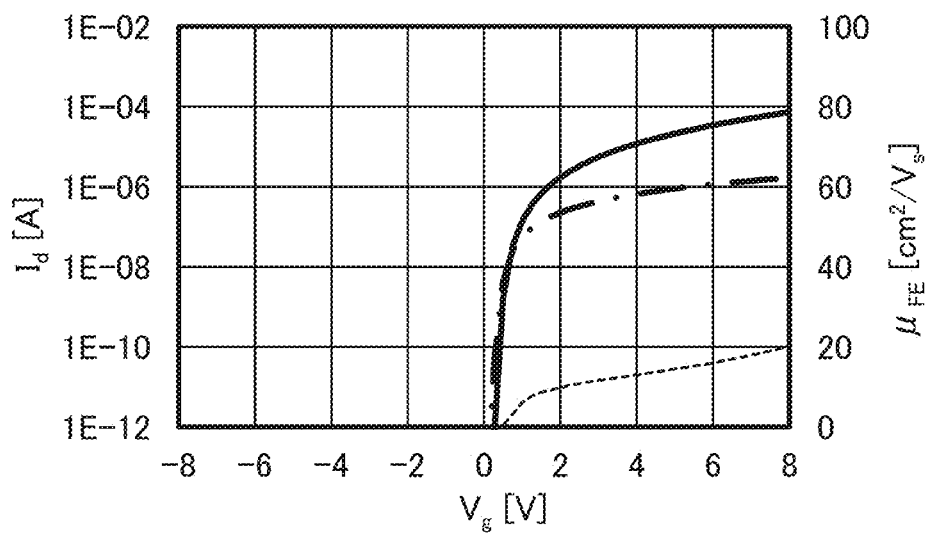
FIG. 27B After peeling
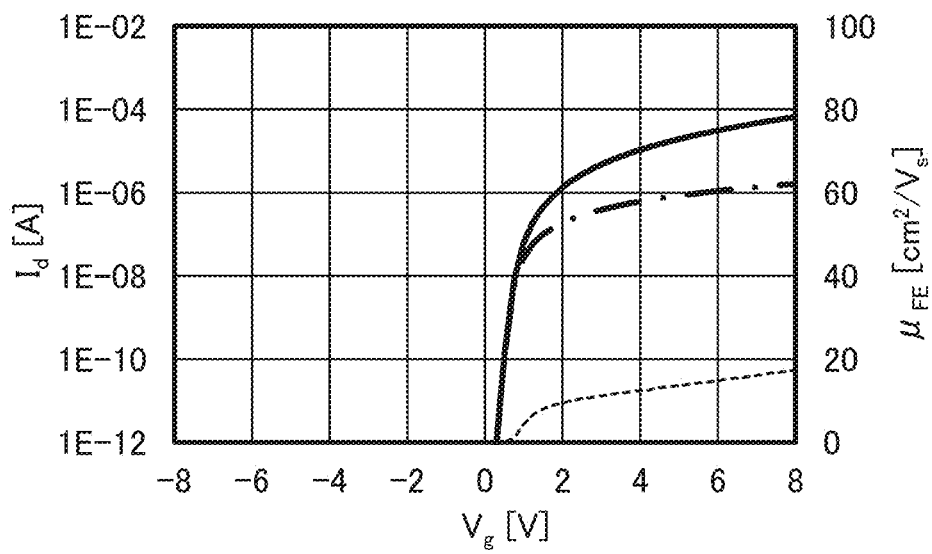

PEELING METHOD AND MANUFACTURING METHOD OF FLEXIBLE DEVICE

BACKGROUND OF THE INVENTION

1. Field of the Invention

One embodiment of the present invention relates to a peeling method and a manufacturing method of a flexible device. One embodiment of the present invention relates to a display device, a display module, and an electronic device. One embodiment of the present invention relates to a display device, a display module, and an electronic device which are flexible.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

2. Description of the Related Art

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. When voltage is applied to this element, light emission can be obtained from the light-emitting organic compound. With the use of such an organic EL element, thin, lightweight, high-contrast, and low-power-consumption display devices can be achieved.

Patent Document 1 discloses a flexible light-emitting device using an organic EL element.

REFERENCE

Patent Document

[Patent Document 1] Japanese Published Patent Application No. 2014-197522

SUMMARY OF THE INVENTION

Flexible devices typified by flexible displays can be obtained by forming semiconductor elements, such as transistors, and other elements over flexible substrates (films). However, flexible substrates have lower heat resistance than glass substrates or the like. Thus, when transistors or the like are directly formed on flexible substrates, the electrical characteristics and reliability of the transistors cannot be improved in some cases.

Thus, a method described in Patent Document 1 in which a semiconductor element, a light-emitting element, or the like formed over a glass substrate over which a peeling layer is formed is peeled and transferred to a flexible substrate has been considered. In this method, the formation temperature of the semiconductor element can be increased; thus, an extremely highly reliable flexible device can be manufactured.

An object of one embodiment of the present invention is to provide a novel peeling method. Another object of one embodiment of the present invention is to provide a peeling method at low cost with high mass productivity. Another object of one embodiment of the present invention is to perform peeling using a large-sized substrate.

An object of one embodiment of the present invention is to provide a novel flexible device and a manufacturing method thereof. Another object of one embodiment of the present invention is to provide a highly reliable flexible device. Another object of one embodiment of the present invention is to manufacture a flexible device at low temperatures. Another object of one embodiment of the present invention is to provide a manufacturing method of a flexible device with a simplified manufacturing process. Another object of one embodiment of the present invention is to provide a manufacturing method of a flexible device at low cost with high mass productivity. Another object of one embodiment of the present invention is to manufacture a flexible device using a large-sized substrate. Another object of one embodiment of the present invention is to provide a device with a curved surface. Another object of one embodiment of the present invention is to provide a lightweight flexible device. Another object of one embodiment of the present invention is to provide a thin flexible device. Another object of one embodiment of the present invention is to provide a flexible device capable of being repeatedly bent.

Note that the descriptions of these objects do not disturb the existence of other objects. One embodiment of the present invention does not necessarily achieve all the objects. Other objects can be derived from the description of the specification, the drawings, and the claims.

(1) One embodiment of the present invention is a peeling method including a step of forming a resin layer having a thickness greater than or equal to 0.1 µm and less than or equal to 3 µm over a formation substrate using a photosensitive and thermosetting material, a step of forming a transistor including an oxide semiconductor in a channel formation region over the resin layer, a step of irradiating the resin layer with light using a linear laser device, and a step of separating the transistor and the formation substrate from each other.

In the above embodiment (1), the resin layer is preferably formed using a solution having a viscosity of greater than or equal to 5 cP and less than 100 cP and further preferably greater than or equal to 10 cP and less than 50 cP.

In the above embodiment (1), the resin layer is preferably formed with a spin coater.

In the above embodiment (1), it is preferable that the resin layer be formed by heating the material at a first temperature and the transistor be formed at a temperature lower than or equal to the first temperature.

In the above embodiment (1), the resin layer is preferably irradiated with light from the formation substrate side using the linear laser device.

(2) Another embodiment of the present invention is a peeling method including a step of forming a first film having a thickness greater than or equal to 0.1 μm and less than or equal to 3 μm over a formation substrate using a photosensitive and thermosetting material, a step of forming a first region and a second region which is thinner than the first region in the first film by a photolithography method, a step of forming a resin layer having the first region and the second region by heating the first film at a first temperature, a step of forming a transistor including an oxide semiconductor in a channel formation region over the resin layer, a step of forming a conductive layer to overlap with the second region of the resin layer, a step of irradiating the resin layer with light using a linear laser device, and a step of separating the transistor and the formation substrate from each other.

(3) Another embodiment of the present invention is a peeling method including a step of forming a first film having a thickness greater than or equal to 0.1 μm and less than or equal to 3 μm over a formation substrate using a photosensitive and thermosetting material, a step of forming an opening in the first film by a photolithography method, a step of forming a resin layer having the opening by heating the first film at a first temperature, a step of forming a transistor including an oxide semiconductor in a channel formation region over the resin layer, a step of forming a conductive layer to overlap with the opening of the resin layer, a step of irradiating the resin layer with light using a linear laser device, and a step of separating the transistor and the formation substrate from each other.

In each of the above embodiments (2) and (3), the conductive layer is preferably formed using the same material and the same fabrication step as an electrode included in the transistor.

Another embodiment of the present invention is a method for manufacturing a flexible device including a step of exposing the conductive layer by separating the transistor and the formation substrate from each other using the peeling method of the above embodiment (2) or (3), and a step of electrically connecting the conductive layer and a circuit board to each other through the opening of the resin layer.

(4) Another embodiment of the present invention is a display device including a resin layer, a transistor over the resin layer, and a display element electrically connected to the transistor. The resin layer has a thickness greater than or equal to 0.1 μm and less than or equal to 3 μm. The transistor includes an oxide semiconductor in a channel formation region. The 5% weight loss temperature of the resin layer is preferably lower than 400° C.

Another embodiment of the present invention is a display module including the display device of the above embodiment (4) and a circuit board. The display device includes a conductive layer. The resin layer has an opening. The conductive layer is electrically connected to the circuit board through the opening.

(5) Another embodiment of the present invention is a display device including a flexible substrate, a first resin layer over the substrate, a first inorganic insulating layer over the first resin layer, a second resin layer over the first inorganic insulating layer, a second inorganic insulating layer over the second resin layer, an oxide semiconductor layer over the second inorganic insulating layer, a first gate insulating layer over the oxide semiconductor layer, a first gate over the first gate insulating layer, a source and a drain each electrically connected to the oxide semiconductor layer, and a display element electrically connected to the source or the drain. The first resin layer has a thickness greater than or equal to 0.1 μm and less than or equal to 3 μm. The 5% weight loss temperature of the first resin layer is preferably lower than 400° C.

In the above embodiment (5), it is preferable that a second gate be provided between the second inorganic insulating layer and the oxide semiconductor layer and a second gate insulating layer be provided between the second gate and the oxide semiconductor layer.

Alternatively, in the above embodiment (5), a second gate is preferably provided between the first inorganic insulating layer and the second resin layer. In that case, the second inorganic insulating layer functions as a second gate insulating layer. Furthermore, a third inorganic insulating layer is preferably provided over the second gate and the first inorganic insulating layer.

(6) Another embodiment of the present invention is a display device including a flexible substrate, a first resin layer over the substrate, a second resin layer over the first resin layer, an inorganic insulating layer over the second resin layer, an oxide semiconductor layer over the inorganic insulating layer, a first gate insulating layer over the oxide semiconductor layer, a first gate over the first gate insulating layer, a source and a drain each electrically connected to the oxide semiconductor layer, a second gate between the first resin layer and the second resin layer, and a display element electrically connected to the source or the drain. The inorganic insulating layer functions as a second gate insulating layer. The first resin layer has a thickness greater than or equal to 0.1 μm and less than or equal to 3 μm.

Another embodiment of the present invention is a display module including the display device of the above embodiment (5) or (6) and a circuit board. The display device includes a conductive layer. The first resin layer has an opening. The conductive layer is electrically connected to the circuit board through the opening.

One embodiment of the present invention is a module including any of the display devices in the above embodiments. The module is provided with a connector such as a flexible printed circuit (hereinafter also referred to as an FPC) or a tape carrier package (TCP) or is mounted with an integrated circuit (IC) by a chip on glass (COG) method, a chip on film (COF) method, or the like.

Any of the above embodiments of the present invention may be applied to a light-emitting device or an input/output device (such as a touch panel) instead of the display device.

One embodiment of the present invention is an electronic device including the module with any of the above structures and at least one of an antenna, a battery, a housing, a camera, a speaker, a microphone, and an operation button.

One embodiment of the present invention can provide a novel peeling method. One embodiment of the present invention can provide a peeling method at low cost with high mass productivity. One embodiment of the present invention can perform peeling using a large-sized substrate.

One embodiment of the present invention can provide a novel flexible device and a manufacturing method thereof. One embodiment of the present invention can provide a highly reliable flexible device. One embodiment of the present invention can manufacture a flexible device at low temperatures. One embodiment of the present invention can provide a manufacturing method of a flexible device with a simplified manufacturing process. One embodiment of the present invention can provide a manufacturing method of a flexible device at low cost with high mass productivity. One embodiment of the present invention can manufacture a flexible device using a large-sized substrate. One embodiment of the present invention can provide a device with a curved surface. One embodiment of the present invention can provide a lightweight flexible device. One embodiment of the present invention can provide a thin flexible device. One embodiment of the present invention can provide a flexible device capable of being repeatedly bent.

Note that the descriptions of these effects do not disturb the existence of other effects. One embodiment of the present invention does not necessarily achieve all the effects. Other effects can be derived from the description of the specification, the drawings, and the claims.

BRIEF DESCRIPTION OF THE DRAWINGS

FIGS. 1A to 1D illustrate an example of a manufacturing method of a flexible device.
FIGS. 2A to 2D illustrate an example of a manufacturing method of a flexible device.
FIGS. 27A and 27B each show $I_d$-$V_g$ characteristics of a transistor of Example 3.

DETAILED DESCRIPTION OF THE INVENTION

Figure 3A:
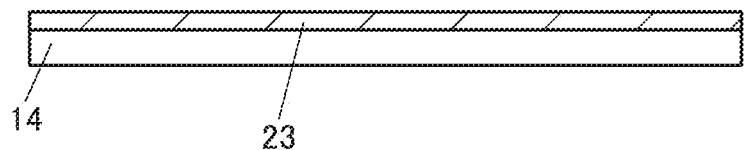
FIGS. 3A to 3E illustrate an example of a manufacturing method of a flexible device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is used for portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". The term "insulating film" can be changed into the term "insulating layer".

Note that in this specification, a "substrate" preferably has a function of supporting at least one of a functional circuit, a functional element, a functional film, and the like. A "substrate" does not necessary have a function of supporting a functional circuit, a functional element, a functional film, and the like, and may have a function of protecting a surface of the device, or a function of sealing at least one of a functional circuit, a functional element, a functional film, and the like, for example.

Embodiment 1

In this embodiment, a peeling method and a manufacturing method of a flexible device of embodiments of the present invention will be described with reference to FIGS. 1A to 1D, FIGS. 2A to 2D, FIGS. 3A to 3E, FIGS. 4A to 4C, FIGS. 5A and 5B, FIGS. 6A to 6D, FIGS. 7A to 7E, FIGS. 8A to 8C, FIGS. 9A to 9C, FIGS. 10A to 10C, FIGS. 11A to 11E, FIGS. 12A and 12B, and FIGS. 13A and 13B.

One embodiment of the present invention is a peeling method which includes a step of forming a resin layer having a thickness greater than or equal to 0.1 μm and less than or equal to 3 μm over a formation substrate using a photosensitive and thermosetting material, a step of forming a transistor including an oxide semiconductor in a channel formation region over the resin layer, a step of irradiating the resin layer with laser light using a linear laser device, and a step of separating the transistor and the formation substrate from each other.

An oxide semiconductor is used for the channel formation region of the transistor. With the use of an oxide semiconductor, the maximum process temperature can be lower than that of the case of using low-temperature polysilicon (LTPS).

In the case of using LTPS for the channel formation region of the transistor, the resin layer is required to have heat resistance because a temperature of approximately 500° C. to 550° C. is applied. The resin layer is required to have a larger thickness to relieve the damage in a laser crystallization step. When the resin layer is irradiated with laser light to peel the transistor from the formation substrate, the resin layer is required to have a larger thickness also to suppress absorption of laser light by silicon because the bandgap of silicon is as narrow as 1.1 eV.

In contrast, the transistor formed using an oxide semiconductor does not need heat treatment at high temperatures unlike the case of LTPS, and can be formed at a temperature lower than or equal to 350° C., or even lower than or equal to 300° C. Thus, the resin layer is not required to have high heat resistance. Accordingly, the heat resistant temperature of the resin layer can be low, and the material can be selected from a wide range. Furthermore, the transistor formed using an oxide semiconductor does not need a laser crystallization step. Furthermore, even in the case where a laser is used in a peeling step, the resin layer can be thinned because the bandgap of an oxide semiconductor is broad, which is greater than or equal to 2.0 eV and less than or equal to 3.5 eV (preferably greater than or equal to 2.5 eV and further preferably greater than or equal to 3 eV), and an oxide semiconductor absorbs less laser light than silicon. Since the resin layer is not required to have high heat resistance and can be thinned, the manufacturing cost of a device can be significantly reduced. An oxide semiconductor is preferably used, in which case the steps can be simplified as compared with the case where LTPS is used.

According to one embodiment of the present invention, a transistor or the like is formed at a temperature lower than or equal to the allowable temperature limit of the resin layer. Here, the heat resistance of the resin layer can be measured by, for example, a weight loss percentage due to heat, specifically, the 5% weight loss temperature. The 5% weight loss temperature of the resin layer can be lower than or equal to 450° C., lower than or equal to 400° C., lower than 400° C., or lower than 350° C., for example. For example, a transistor is formed at a temperature lower than or equal to 350° C., or even lower than or equal to 300° C.

In one embodiment of the present invention, the resin layer is formed using a photosensitive material. With the photosensitive material, a resin layer with a desired shape can be easily formed. For example, a resin layer having an opening or a resin layer having two or more regions with different thicknesses can be easily formed. Accordingly, the resin layer can be prevented from hindering formation of a back gate, an external connection terminal, a through electrode, or the like.

According to one embodiment of the present invention, irradiation with laser light is performed with a linear laser device. A laser apparatus used in a manufacturing line for LTPS or the like can be effectively used. The linear laser device condenses laser light in a long rectangular shape (the laser light is shaped into a linear laser beam) so that the resin layer is irradiated with light.

A flexible device can be manufactured using a peeling method of one embodiment of the present invention. An example of a manufacturing method of a flexible device is shown with reference to FIGS. 1A to 1D and FIGS. 2A to 2D.

First, as illustrated in FIG. 1A, a first stack 110 and a second stack 120 are attached to each other with a bonding layer 132.

The first stack 110 includes a formation substrate 111, a resin layer 112, an insulating layer 113, a layer 114 including a transistor, and a display element 131.

Here, the display element 131 is preferably positioned within 10 μm, further preferably 5 μm, and still further preferably 2.5 μm, from a neutral plane.

A region having low adhesion may be generated in the display element 131 in the case where an EL element is used for the display element 131, for example. Stress applied to the display element 131 can be reduced by arranging the display element 131 in a position closer to the neutral plane. In addition, in a peeling step in manufacturing a display device or at the use of the display device by being bent, for example, occurrence of film separation can be suppressed.

The resin layer 112 is formed to a thickness greater than or equal to 0.1 μm and less than or equal to 3 μm using a photosensitive and thermosetting material.

The layer 114 includes a transistor including an oxide semiconductor in a channel formation region.

The second stack 120 includes a formation substrate 121, a resin layer 122, an insulating layer 123, and a functional layer 124.

The resin layer 122 is formed to a thickness greater than or equal to 0.1 μm and less than or equal to 3 μm using a photosensitive and thermosetting material. The functional layer 124 includes at least one of a coloring layer such as a color filter, a light-blocking layer such as a black matrix, and a sensor element such as a touch sensor.

Next, as illustrated in FIG. 1B, the resin layer 112 is irradiated with laser light 160 through the formation substrate 111. A linear laser device is preferably used for the laser light irradiation. A light source is relatively moved with respect to the formation substrate 111 to perform the laser light irradiation. Although an example in which the formation substrate 111 is separated ahead of the formation substrate 121 is shown here, one embodiment of the present invention is not limited thereto. When the formation substrate 121 is separated ahead, the resin layer 122 is irradiated with laser light through the formation substrate 121 with a linear laser device.

Then, as illustrated in FIG. 1C, the formation substrate 111 and the insulating layer 113 are separated from each other. FIG. 1C illustrates an example in which separation occurs in the resin layer 112. Part of the resin layer (a resin layer 112a) remains over the formation substrate 111. The thickness of the resin layer 112 remaining on the insulating layer 113 side is reduced as compared with that in FIG. 1B. Note that separation occurs at an interface between the formation substrate 111 and the resin layer 112 in some cases depending on the manufacturing conditions (a material of the resin layer 112, the laser irradiation conditions, and the like).

Next, as illustrated in FIG. 1D, the exposed resin layer 112 and a substrate 141 are attached to each other. The substrate 141 preferably has flexibility. For example, the resin layer 112 and the substrate 141 can be attached to each other with an adhesive.

Next, as illustrated in FIG. 2A, the resin layer 122 is irradiated with the laser light 160 through the formation substrate 121. A linear laser device is preferably used for the laser light irradiation. A light source is relatively moved with respect to the formation substrate 121 to perform the laser light irradiation.

Then, as illustrated in FIG. 2B, the formation substrate 121 and the insulating layer 123 are separated from each other. FIG. 2B illustrates an example in which separation occurs in the resin layer 122. Part of the resin layer (a resin layer 122a) remains over the formation substrate 121. The thickness of the resin layer 122 remaining on the insulating layer 123 side is reduced as compared with that in FIG. 2A.

Next, as illustrated in FIG. 2C, the exposed resin layer 122 and a substrate 151 are attached to each other. The substrate 151 preferably has flexibility.

Through the above steps, a flexible device 100 illustrated in FIG. 2D can be fabricated.

In the peeling method and the manufacturing method of a flexible device of embodiments of the present invention, the fabrication process of the transistor can be performed at a low temperature with the use of an oxide semiconductor in the channel formation region of the transistor. Furthermore, the resin layer can have a small thickness and low heat resistance. Thus, there are advantages in that the material of the resin layer can be selected from a wide range, high mass productivity can be obtained at low cost, and peeling and fabrication of a flexible device can be performed using a large-sized substrate, for example.

The manufacturing method of a flexible device of one embodiment of the present invention will be more specifically described below with reference to FIGS. 3A to 3E, FIGS. 4A to 4C, FIGS. 5A and 5B, FIGS. 6A to 6D, FIGS. 7A to 7E, FIGS. 8A to 8C, FIGS. 9A to 9C, FIGS. 10A to 10C, FIGS. 11A to 11E, FIGS. 12A and 12B, and FIGS. 13A and 13B. Here, an example in which a display device including a transistor and an organic EL element (also referred to as an active matrix organic EL display device) is fabricated as the flexible device will be described. With the use of a flexible material for a substrate, the display device can be a foldable organic EL display device.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of the photolithography method include a method in which a resist mask is formed over a thin film to be processed, the thin film is processed by etching or the like, and the resist mask is removed, and a method in which a photosensitive thin film is formed, exposed to light, and developed to be processed into a desired shape.

In the case of using light in a lithography method, as light used for exposure, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

Manufacturing Method Example 1

First, a resin layer 23 is formed over a formation substrate 14 using a photosensitive and thermosetting material (FIG. 3A).

Specifically, the resin layer 23 is formed by depositing the photosensitive and thermosetting material to a thickness greater than or equal to 0.1 μm and less than or equal to 3 μm and performing heating. By heating, released gas components (e.g., hydrogen and/or water) in the resin layer 23 can be reduced. It is particularly preferable that the photosensitive and thermosetting material be heated at a temperature higher than or equal to the formation temperature of each layer formed over the resin layer 23. For example, in the case where the formation temperature of the transistor is below 350° C., a film to be the resin layer 23 is preferably heated at a temperature higher than or equal to 350° C. and lower than or equal to 450° C., further preferably higher than or equal to 350° C. and lower than or equal to 400° C., still further preferably higher than or equal to 350° C. and lower than 400° C., and yet still further preferably higher than or equal to 350° C. and lower than 375° C. Thus, a gas released from the resin layer 23 in the fabrication process of the transistor can be significantly reduced.

Since the film to be the resin layer 23 is formed using the photosensitive material in one embodiment of the present invention, part of the film can be removed by a photolithography method. Specifically, after the material is deposited, heat treatment (also referred to as pre-baking) for removing a solvent is performed, and then light exposure is performed using a photomask. Next, development is performed, whereby an unnecessary portion can be removed. After that, heat treatment (also referred to as post-baking) is preferably performed. In the post-baking, heating is preferably performed at a temperature higher than or equal to the formation temperature of each layer formed over the resin layer 23.

The resin layer 23 has flexibility. The formation substrate 14 has lower flexibility than the resin layer 23 does. Since the resin layer 23 is formed over the formation substrate 14, the resin layer 23 can be transferred easily.

The resin layer 23 is preferably formed using a photosensitive polyimide resin (also referred to as a PSPI).

Examples of a material which can be used to form the resin layer 23 include an acrylic resin, an epoxy resin, a polyamide resin, a polyimide-amide resin, a siloxane resin, a benzocyclobutene-based resin, and a phenol resin.

The resin layer 23 is preferably formed with a spin coater. By a spin coating method, a thin film can be uniformly formed over a large-sized substrate.

The resin layer 23 is preferably formed using a solution having a viscosity of greater than or equal to 5 cP and less than 500 cP, further preferably greater than or equal to 5 cP and less than 100 cP, and still further preferably greater than or equal to 10 cP and less than or equal to 50 cP. As the viscosity of the solution is lower, application is performed more easily. As the viscosity of the solution is lower, inclusion of air bubbles can be reduced more; thus, a high-quality film can be formed.

The resin layer 23 preferably has a thickness greater than or equal to 0.01 μm and less than 10 μm, further preferably greater than or equal to 0.1 μm and less than or equal to 5 μm, still further preferably greater than or equal to 0.1 μm and less than or equal to 3 μm, and yet still further preferably greater than or equal to 0.5 μm and less than or equal to 1 μm. With a solution having low viscosity, the resin layer 23 having a small thickness can be easily formed. By forming the resin layer 23 thin, the display device can be fabricated at low cost. The display device can be light-weight and thin. The display device can have higher flexibility. The thickness of the resin layer 23 is not limited thereto, and may be greater than or equal to 10 µm. For example, the resin layer 23 may have a thickness greater than or equal to 10 µm and less than or equal to 200 µm. The resin layer 23 having a thickness greater than or equal to 10 µm is favorable because the rigidity of the display device can be increased.

The resin layer 23 can be formed by dip coating, spray coating, ink jetting, dispensing, screen printing, or offset printing, with a doctor knife, a slit coater, a roll coater, a curtain coater, or a knife coater.

The resin layer 23 preferably has a thermal expansion coefficient of greater than or equal to 0.1 ppm/° C. and less than or equal to 20 ppm/° C. and further preferably greater than or equal to 0.1 ppm/° C. and less than or equal to 10 ppm/° C. As the resin layer 23 has a lower thermal expansion coefficient, breakage of a transistor or the like which is caused owing to the heating can be further suppressed.

In the case where the resin layer 23 is positioned on the display surface side of the display device, the resin layer 23 preferably has a high visible-light transmitting property.

The formation substrate 14 has stiffness high enough for easy transfer and has resistance to heat applied in the fabrication process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

Figure 3B:
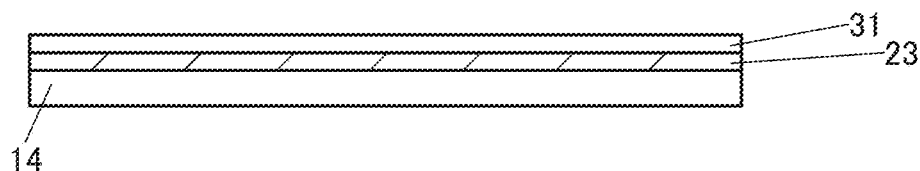

Next, an insulating layer 31 is formed over the resin layer 23 (FIG. 3B).

The insulating layer 31 is formed at a temperature lower than or equal to the allowable temperature limit of the resin layer 23. The insulating layer 31 is preferably formed at a temperature lower than or equal to the heating temperature in the above-described heating step of the resin layer 23.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 23 and a silicon oxide film be formed over the silicon nitride film. An inorganic insulating film is preferably formed at high temperatures because the film can have higher density and a higher barrier property as the deposition temperature becomes higher.

In the case of using an inorganic insulating film for the insulating layer 31, the substrate temperature during the deposition is preferably higher than or equal to room temperature (25° C.) and lower than or equal to 350° C. and further preferably higher than or equal to 100° C. and lower than or equal to 300° C.

In the case where the resin layer 23 has an uneven surface, the insulating layer 31 preferably covers the unevenness. The insulating layer 31 may function as a planarization layer that fills the unevenness. It is preferable to use a stack including an organic insulating material and an inorganic insulating material for the insulating layer 31, for example. As the organic insulating material, the resin that can be used for the resin layer 23 can be used.

In the case of using an organic insulating film for the insulating layer 31, a temperature applied to the resin layer 23 at the formation of the insulating layer 31 is preferably higher than or equal to room temperature and lower than or equal to 350° C. and further preferably higher than or equal to room temperature and lower than or equal to 300° C.

Figure 3C:
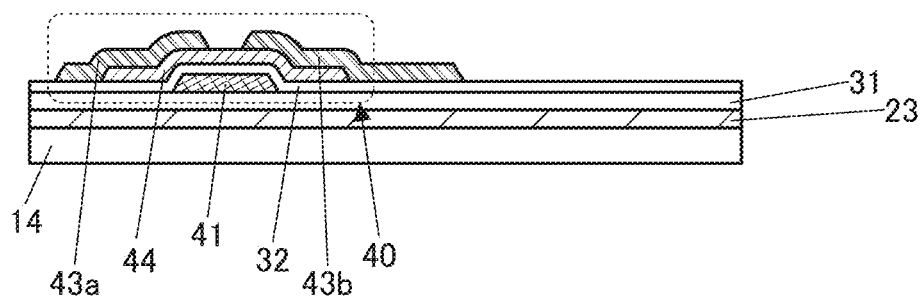

Next, a transistor 40 is formed over the insulating layer 31 (FIG. 3C).

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

Here, the case where a bottom-gate transistor including an oxide semiconductor layer 44 is formed as the transistor 40 is described.

In one embodiment of the present invention, an oxide semiconductor is used as a semiconductor of a transistor. A semiconductor material having a wider bandgap and a lower carrier density than silicon is preferably used because an off-state current of the transistor can be reduced.

The transistor 40 is formed at a temperature lower than or equal to the allowable temperature limit of the resin layer 23. In addition, the transistor 40 is preferably formed at a temperature lower than or equal to the heating temperature in the above-described heating step of the resin layer 23.

Specifically, first, a conductive layer 41 is formed over the insulating layer 31. The conductive layer 41 can be formed in the following manner: a conductive film is formed, a resist mask is formed, the conductive film is etched, and the resist mask is removed.

The substrate temperature during the deposition of the conductive film is preferably higher than or equal to room temperature and lower than or equal to 350° C. and further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO to which gallium is added, or indium tin oxide containing silicon may be used. Alternatively, a semiconductor such as an oxide semiconductor or polycrystalline silicon whose resistance is lowered by containing an impurity element, for example, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed. For the insulating layer 32, the description of the inorganic insulating film that can be used for the insulating layer 31 can be referred to.

Then, the oxide semiconductor layer 44 is formed. The oxide semiconductor layer 44 can be formed in the following manner: an oxide semiconductor film is formed, a resist mask is formed, the oxide semiconductor film is etched, and the resist mask is removed.

The substrate temperature during the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

The oxide semiconductor film can be formed using one or both of an inert gas and an oxygen gas. Note that there is no particular limitation on the percentage of oxygen flow rate (partial pressure of oxygen) at the time of forming the oxide semiconductor film. To fabricate a transistor having high field-effect mobility, however, the percentage of oxygen flow rate (partial pressure of oxygen) at the time of forming the oxide semiconductor film is preferably higher than or equal to 0% and lower than or equal to 30%, further preferably higher than or equal to 5% and lower than or equal to 30%, and still further preferably higher than or equal to 7% and lower than or equal to 15%.

As an oxide target that can be used for forming the oxide semiconductor film, an In-M-Zn-based oxide (M is Al, Ga, Y, or Sn) can be used. It is particularly preferable to use an In—Ga—Zn-based oxide.

The oxide semiconductor film can be formed by a sputtering method. Alternatively, a PLD method, a PECVD method, a thermal CVD method, an ALD method, or a vacuum evaporation method may be used, for example.

Next, a conductive layer 43a and a conductive layer 43b are formed. The conductive layers 43a and 43b can be formed in the following manner: a conductive film is formed, a resist mask is formed, the conductive film is etched, and the resist mask is removed.

Note that during the processing of the conductive layers 43a and 43b, the oxide semiconductor layer 44 might be partly etched to be thin in a region not covered by the resist mask.

The substrate temperature during the deposition of the conductive film is preferably higher than or equal to room temperature and lower than or equal to 350° C. and further preferably higher than or equal to room temperature and lower than or equal to 300° C.

In the above manner, the transistor 40 can be formed (FIG. 3C). In the transistor 40, part of the conductive layer 41 functions as a gate, part of the insulating layer 32 functions as a gate insulating layer, and the conductive layers 43a and 43b function as a source and a drain.

Figure 3D:
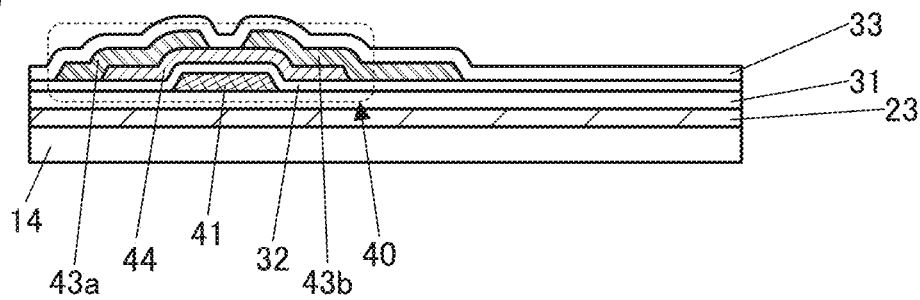

Next, an insulating layer 33 that covers the transistor 40 is formed (FIG. 3D). The insulating layer 33 can be formed in a manner similar to that of the insulating layer 31.

It is preferable to use an oxide insulating film, such as a silicon oxide film or a silicon oxynitride film, formed at a low temperature in the above range in an atmosphere containing oxygen for the insulating layer 33. An insulating film with low oxygen diffusibility and oxygen permeability, such as a silicon nitride film, is preferably stacked over the silicon oxide film or the silicon oxynitride film. The oxide insulating film formed at low temperatures in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the oxide semiconductor layer 44. As a result, oxygen vacancies in the oxide semiconductor layer 44 can be filled and defects at the interface between the oxide semiconductor layer 44 and the insulating layer 33 can be repaired, leading to a reduction in defect levels. Accordingly, an extremely highly reliable flexible device can be fabricated.

Through the above steps, the insulating layer 31, the transistor 40, and the insulating layer 33 can be formed over the resin layer 23 (FIG. 3D).

If the formation substrate 14 and the insulating layer 31 are separated from each other at this stage by a method described later, a flexible device including no display element can be fabricated. Forming the transistor 40 or forming a capacitor, a resistor, a wiring, and the like in addition to the transistor 40, and separating the formation substrate 14 and the transistor 40 from each other by the method described later can provide a flexible device including a semiconductor circuit, for example.

Figure 3E:
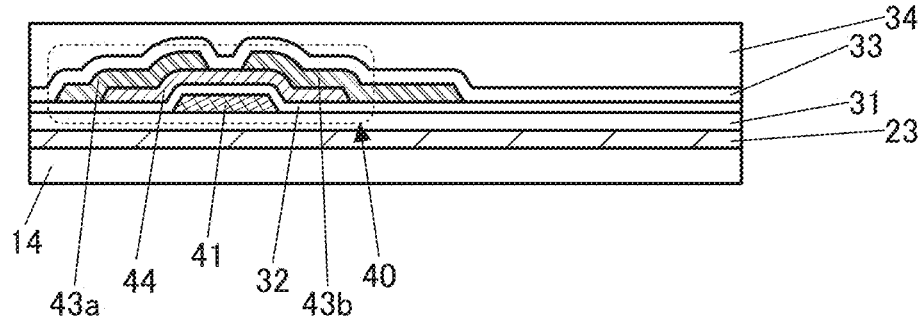

Then, an insulating layer 34 is formed over the insulating layer 33 (FIG. 3E). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the allowable temperature limit of the resin layer 23. The insulating layer 34 is preferably formed at a temperature lower than or equal to the heating temperature in the above-described heating step of the resin layer 23.

In the case of using an organic insulating film for the insulating layer 34, a temperature applied to the resin layer 23 at the formation of the insulating layer 34 is preferably higher than or equal to room temperature and lower than or equal to 350° C. and further preferably higher than or equal to room temperature and lower than or equal to 300° C.

In the case of using an inorganic insulating film for the insulating layer 34, the substrate temperature during the deposition is preferably higher than or equal to room temperature and lower than or equal to 350° C. and further preferably higher than or equal to 100° C. and lower than or equal to 300° C.

Next, an opening that reaches the conductive layer 43b is formed in the insulating layer 34 and the insulating layer 33.

Figure 4A:
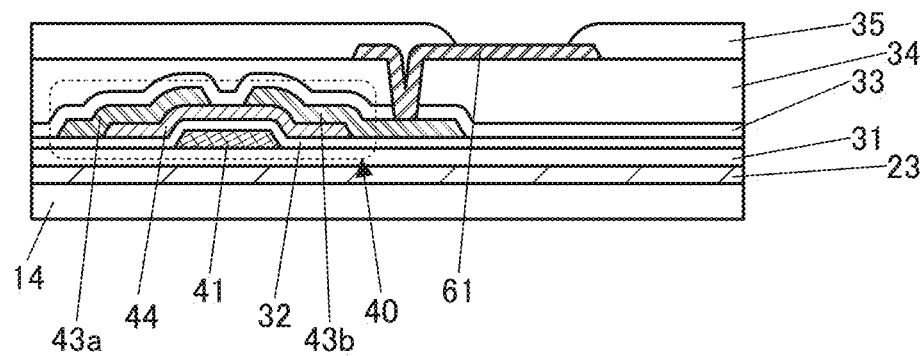
FIGS. 4A to 4C illustrate an example of a manufacturing method of a flexible device.

After that, a conductive layer 61 is formed (FIG. 4A). Part of the conductive layer 61 functions as a pixel electrode of a display element 60. The conductive layer 61 can be formed in the following manner: a conductive film is formed, a resist mask is formed, the conductive film is etched, and the resist mask is removed.

The conductive layer 61 is formed at a temperature lower than or equal to the allowable temperature limit of the resin layer 23. The conductive layer 61 is preferably formed at a temperature lower than or equal to the heating temperature in the above-described heating step of the resin layer 23.

The substrate temperature during the deposition of the conductive film is preferably higher than or equal to room temperature and lower than or equal to 350° C. and further preferably higher than or equal to room temperature and lower than or equal to 300° C.

Subsequently, an insulating layer 35 that covers an end portion of the conductive layer 61 is formed (FIG. 4A). For the insulating layer 35, the description of the organic insulating film or the inorganic insulating film that can be used for the insulating layer 31 can be referred to.

The insulating layer 35 is formed at a temperature lower than or equal to the allowable temperature limit of the resin layer 23. The insulating layer 35 is preferably formed at a temperature lower than or equal to the heating temperature in the above-described heating step of the resin layer 23.

In the case of using an organic insulating film for the insulating layer 35, a temperature applied to the resin layer 23 at the formation of the insulating layer 35 is preferably higher than or equal to room temperature and lower than or equal to 350° C. and further preferably higher than or equal to room temperature and lower than or equal to 300° C.

In the case of using an inorganic insulating film for the insulating layer 35, the substrate temperature during the deposition is preferably higher than or equal to room temperature and lower than or equal to 350° C. and further preferably higher than or equal to 100° C. and lower than or equal to 300° C.

Figure 4B:
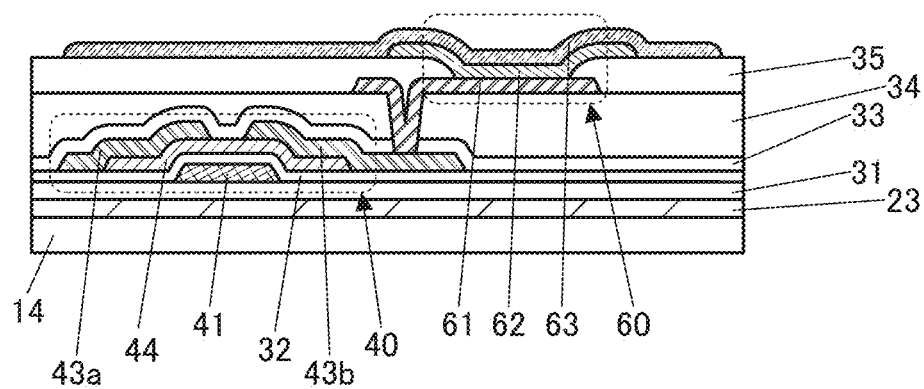

Then, an EL layer 62 and a conductive layer 63 are formed (FIG. 4B). Part of the conductive layer 63 functions as a common electrode of the display element 60.

The EL layer 62 can be formed by an evaporation method, a coating method, a printing method, a discharge method, or the like. In the case where the EL layer 62 is formed for each individual pixel, an evaporation method using a blocking mask such as a metal mask, an ink-jet method, or the like can be used. In the case of sharing the EL layer 62 by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The EL layer 62 and the conductive layer 63 are each formed at a temperature lower than or equal to the allowable temperature limit of the resin layer 23. The EL layer 62 and the conductive layer 63 are each preferably formed at a temperature lower than or equal to the heating temperature in the above-described heating step of the resin layer 23. The conductive layer 63 is formed at a temperature lower than or equal to the allowable temperature limit of the EL layer 62.

Specifically, the EL layer 62 and the conductive layer 63 are each preferably formed at a temperature higher than or equal to room temperature and lower than or equal to 350° C. and further preferably higher than or equal to room temperature and lower than or equal to 300° C.

In the above manner, the display element 60 can be completed (FIG. 4B). In the display element 60, the conductive layer 61 part of which functions as a pixel electrode, the EL layer 62, and the conductive layer 63 part of which functions as a common electrode are stacked.

Although a top-emission light-emitting element is formed as the display element 60 here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Figure 4C:
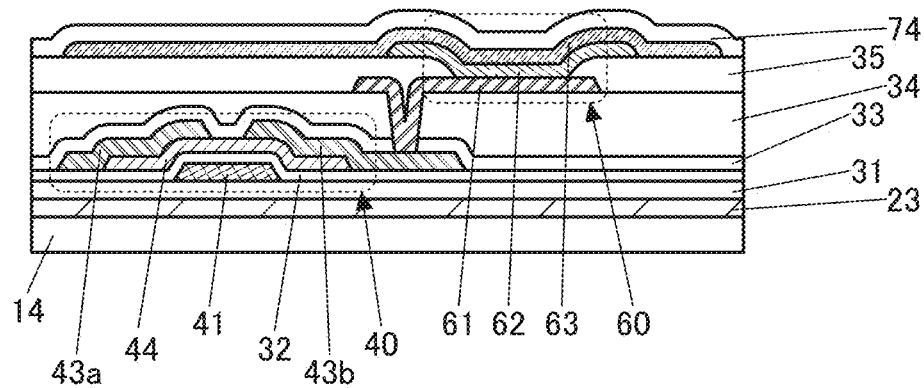

Next, an insulating layer 74 is formed so as to cover the conductive layer 63 (FIG. 4C). The insulating layer 74 functions as a protective layer that suppresses diffusion of impurities such as water into the display element 60. The display element 60 is sealed with the insulating layer 74.

The insulating layer 74 is formed at a temperature lower than or equal to the allowable temperature limit of the resin layer 23 and lower than or equal to the allowable temperature limit of the display element 60. The insulating layer 74 is preferably formed at a temperature lower than or equal to the heating temperature in the above-described heating step of the resin layer 23.

The insulating layer 74 preferably includes an inorganic insulating film with a high barrier property that can be used for the insulating layer 31. A stack including an inorganic insulating film and an organic insulating film can also be used.

Figure 5A:
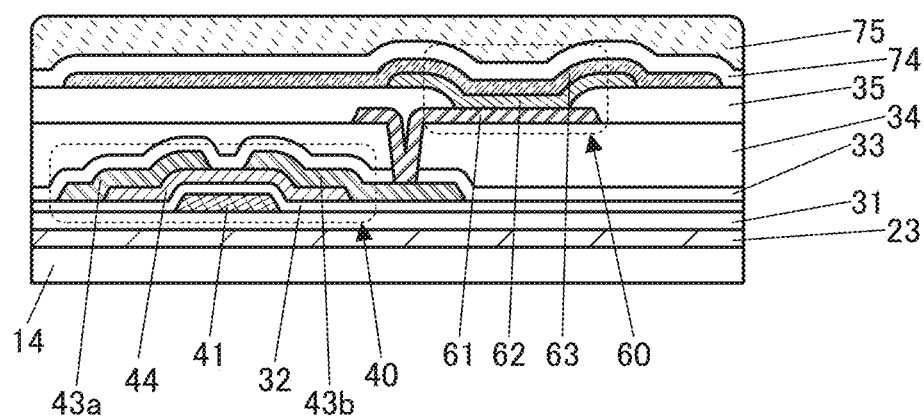
FIGS. 5A and 5B each illustrate an example of a manufacturing method of a flexible device.

Then, a protective layer 75 is formed over the insulating layer 74 (FIG. 5A). The protective layer 75 can be used as a layer positioned on the outermost surface of a display device 10. The protective layer 75 preferably has a high visible-light transmitting property.

The above-described organic insulating film that can be used for the insulating layer 31 is preferably used for the protective layer 75 because the surface of the display device can be prevented from being damaged or cracked. In the protective layer 75, the organic insulating film and a hard coat layer (e.g., a silicon nitride layer) for protecting a surface from damage or the like, a layer formed of a material that can disperse pressure (e.g., an aramid resin layer), or the like may be stacked.

Figure 5B:
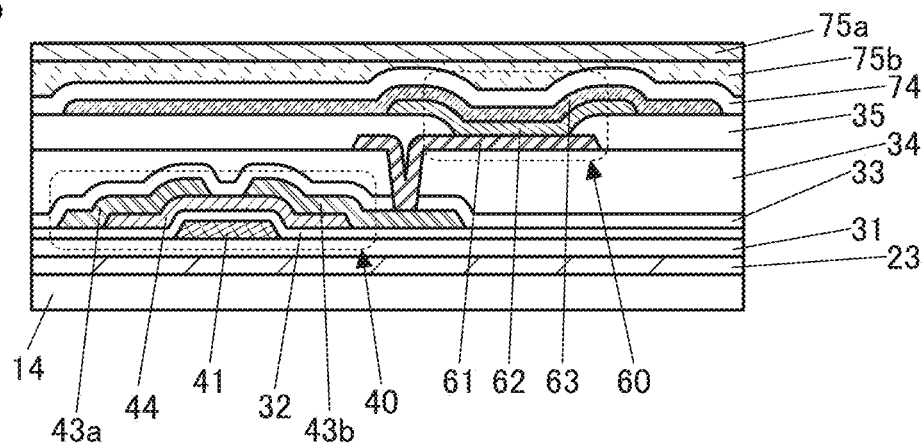

FIG. 5B illustrates an example in which a substrate 75a is attached to the insulating layer 74 with a bonding layer 75b. Examples of the substrate 75a include a resin and the like. The substrate 75a preferably has flexibility.

As the bonding layer 75b, any of a variety of curable adhesives such as a reactive curable adhesive, a thermosetting adhesive, an anaerobic adhesive, and a photocurable adhesive such as an ultraviolet curable adhesive can be used. Alternatively, an adhesive sheet or the like may be used.

For the substrate 75a, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example.

Figure 6A:
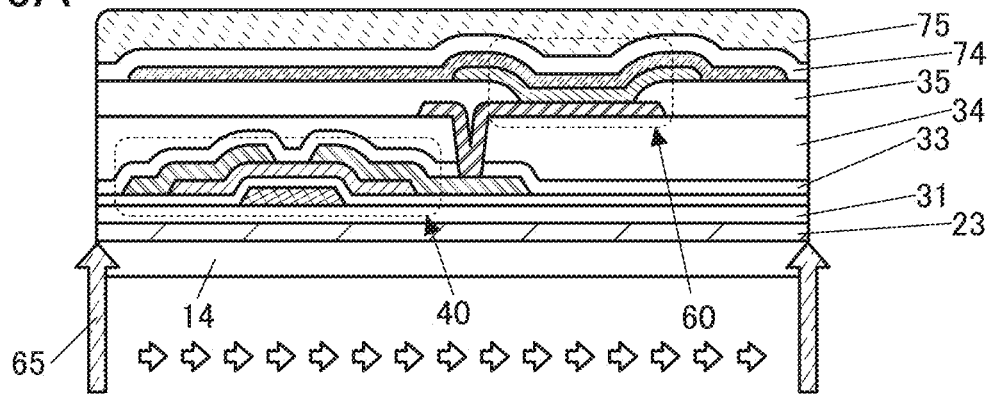
FIGS. 6A to 6D illustrate an example of a manufacturing method of a flexible device.

Next, the resin layer 23 is irradiated with laser light 65 through the formation substrate 14 (FIG. 6A).

For example, an excimer laser with a wavelength of 308 nm, a solid-state UV laser with a wavelength of 343 nm or 355 nm, or the like can be used. A linear laser device is preferably used for the laser light irradiation. A light source is relatively moved with respect to the formation substrate 14 to perform the laser light irradiation.

A solid-state laser is preferable because the solid-state laser does not use a gas and thus the running cost can be reduced to approximately ⅓ of the case of an excimer laser.

Figure 6B:
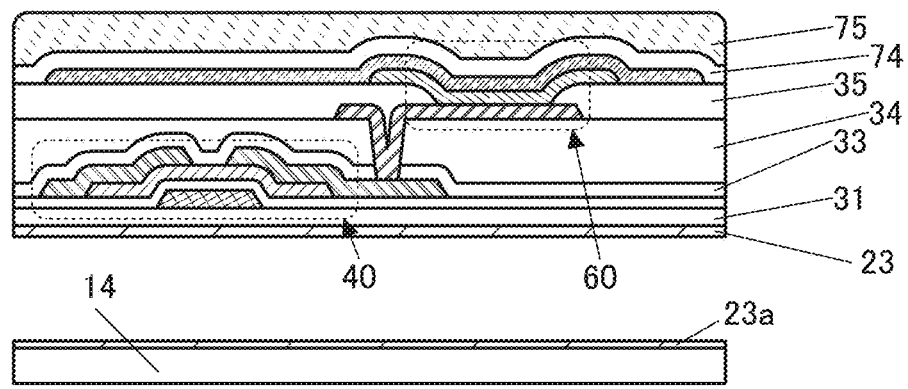

Then, the formation substrate 14 and the insulating layer 31 are separated from each other (FIG. 6B). FIG. 6B illustrates an example in which separation occurs in the resin layer 23. Part of the resin layer (a resin layer 23a) remains over the formation substrate 14. The thickness of the resin layer 23 remaining on the insulating layer 31 side is reduced as compared with that in FIG. 6A.

The thickness of the resin layer 23a remaining on the formation substrate 14 side can be less than or equal to 100 nm, specifically approximately greater than or equal to 40 nm and less than or equal to 70 nm. The formation substrate 111 can be reused by removing the resin layer 23a. For example, in the case where glass is used for the formation substrate 14 and a polyimide resin is used for the resin layer 23, the resin layer 23a can be removed with fuming nitric acid. Alternatively, the resin layer 23 may be formed again over the resin layer 23a remaining on the formation substrate 14 using a photosensitive and thermosetting material.

At least part of the resin layer 23 can be peeled from the formation substrate 14 by applying a perpendicular tensile force to the resin layer 23, for example.

Specifically, at least part of the resin layer 23 can be peeled from the formation substrate 14 by attaching a mechanism to part of the top surface of the protective layer 75 and pulling up the protective layer 75.

The separation trigger is preferably formed by inserting a sharp instrument such as a knife between the formation substrate 14 and the insulating layer 31.

Figure 6C:
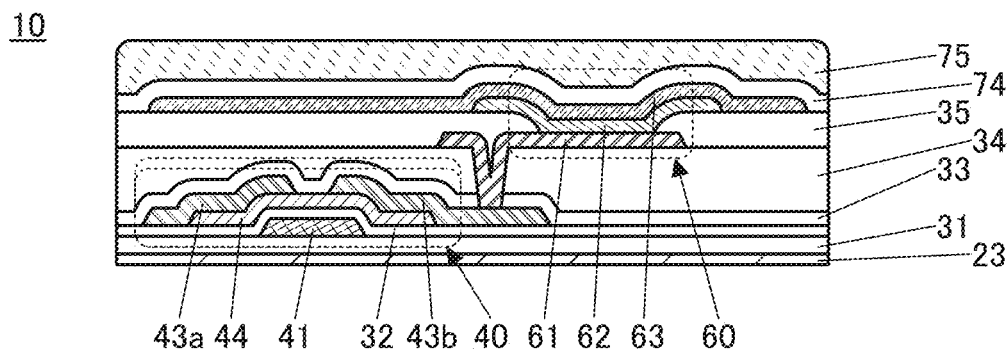

The separation of the formation substrate 14 and the insulating layer 31 can complete the display device 10 (FIG. 6C). The display device 10 can remain being bent or can be bent repeatedly, for example.

Figure 6D:
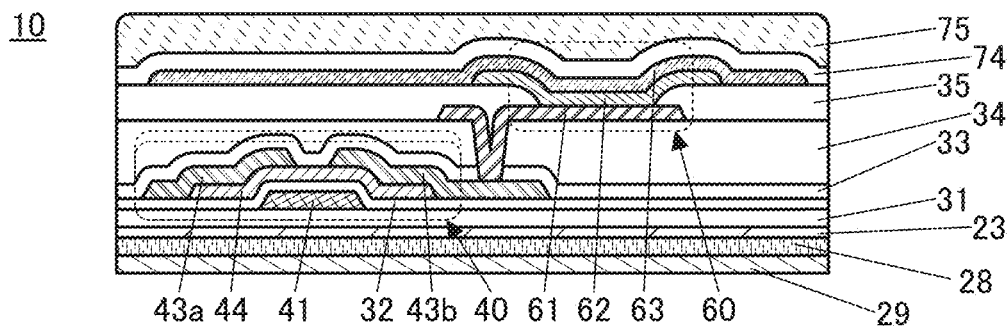

As illustrated in FIG. 6D, a substrate 29 may be attached to the surface exposed by the separation, with a bonding layer 28. The substrate 29 can function as a supporting substrate of the flexible device. FIG. 6D illustrates an example in which the substrate 29 is attached to the resin layer 23 with the bonding layer 28.

The material that can be used for the substrate 75a can be used for the substrate 29.

Through the above steps, the display device using an oxide semiconductor for the transistor and a separate coloring method for an EL element can be fabricated.

Manufacturing Method Example 2

Figure 7A:
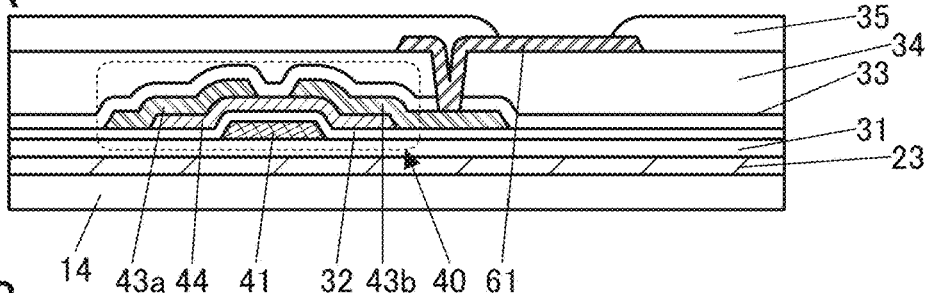
FIGS. 7A to 7E illustrate an example of a manufacturing method of a flexible device.

First, components from the resin layer 23 to the insulating layer 35 are formed in order over the formation substrate 14 in a manner similar to that in the manufacturing method example 1 (FIG. 7A).

Figure 7B:
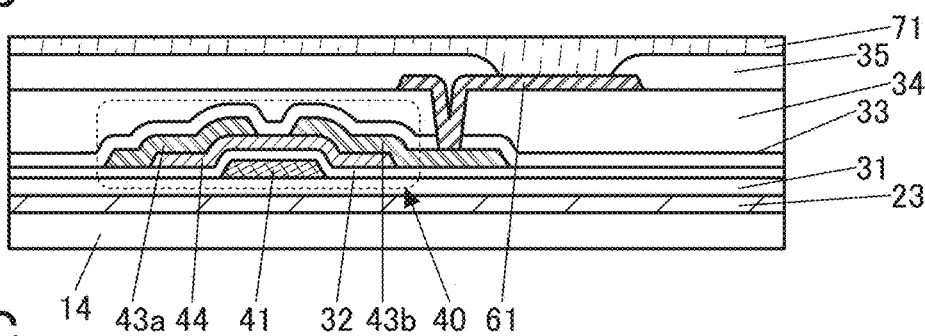

Then, a protective layer 71 is formed as illustrated in FIG. 7B.

The protective layer 71 has a function of protecting surfaces of the insulating layer 35 and the conductive layer 61 in a peeling step. The protective layer 71 can be formed using a material that can be easily removed.

For the protective layer 71 that can be removed, a water-soluble resin can be used, for example. A water-soluble resin is applied to an uneven surface to cover the unevenness, which facilitates the protection of the surface. A stack of a water-soluble resin and an adhesive that can be peeled by light or heat may be used for the protective layer 71 that can be removed.

Alternatively, for the protective layer 71 that can be removed, a base material having a property in which adhesion is strong in a normal state but weakened when irradiated with light or heated may be used. For example, a thermal peeling tape whose adhesion is weakened by heat, a UV-peeling tape whose adhesion is weakened by ultraviolet irradiation, or the like may be used. Alternatively, a weak adhesion tape with weak adhesion in a normal state or the like can be used.

Figure 7C:
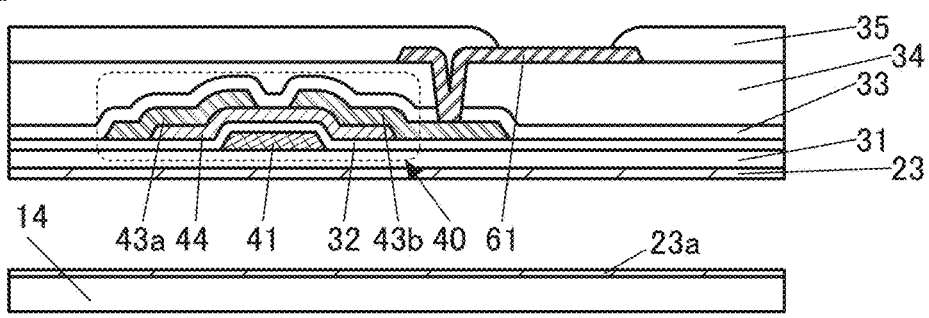

Next, the formation substrate 14 and the insulating layer 31 are separated from each other in a manner similar to that in the manufacturing method example 1 (FIG. 7C). FIG. 7C illustrates an example in which separation occurs in the resin layer 23. Part of the resin layer (resin layer 23a) remains over the formation substrate 14. The thickness of the resin layer 23 remaining on the insulating layer 31 side is reduced as compared with that in FIG. 7B.

After the formation substrate 14 and the insulating layer 31 are separated from each other, the protective layer 71 is removed (FIG. 7C).

Figure 7D:
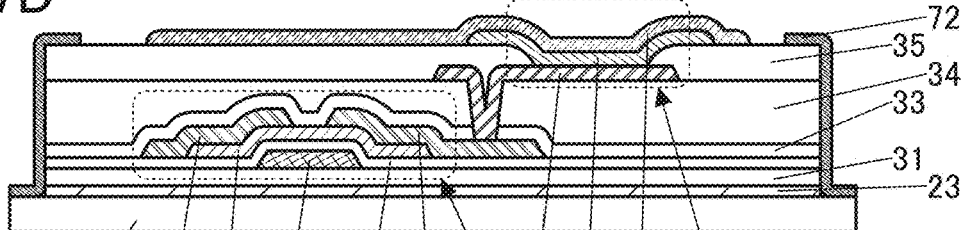

Next, the EL layer 62 and the conductive layer 63 are formed, whereby the display element 60 is completed (FIG. 7D).

The EL layer 62 and the conductive layer 63 may be formed while the resin layer 23 (or the insulating layer 31) is fixed to a stage of a deposition apparatus, but are preferably formed while the resin layer 23 is fixed to a supporting substrate 73 by a tape 72 or the like and the supporting substrate 73 is placed on the stage, as illustrated in FIG. 7D. Fixing the resin layer 23 to the supporting substrate 73 can facilitate the transfer of the resin layer 23 in an apparatus and between apparatuses. The substrate that can be used as the formation substrate 14 can be used as the supporting substrate 73.

Figure 7E:
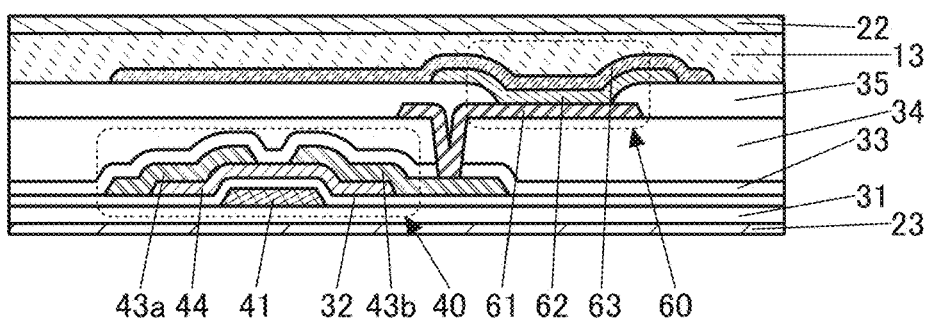

Then, a substrate 22 is attached to the display element 60 with a bonding layer 13. Accordingly, the display element 60 can be sealed by the bonding layer 13 and the substrate 22 (FIG. 7E).

The material that can be used for the bonding layer 75b can be used for the bonding layer 13.

The material that can be used for the substrate 75a can be used for the substrate 22.

Note that in a manner similar to that in the manufacturing method example 1, the insulating layer 74 may be formed over the display element 60 and the display element 60 may be sealed by the insulating layer 74. Then, the protective layer 75 may be formed over the insulating layer 74.

Through the above steps, the display device 10 can be completed (FIG. 7E).

In the manufacturing method example 2, after a layer is peeled from the formation substrate 14, the EL layer 62 and the conductive layer 63 can be formed over the layer. In the case where a region having low adhesion is generated in a stacked-layer structure of the EL layer 62 and the like, the stacked-layer structure is formed after peeling so that a decrease in the yield of peeling can be suppressed. With the use of the manufacturing method example 2, a material can be selected more freely, leading to fabrication of a highly reliable display device at lower cost.

Manufacturing Method Example 3

Figure 8A:
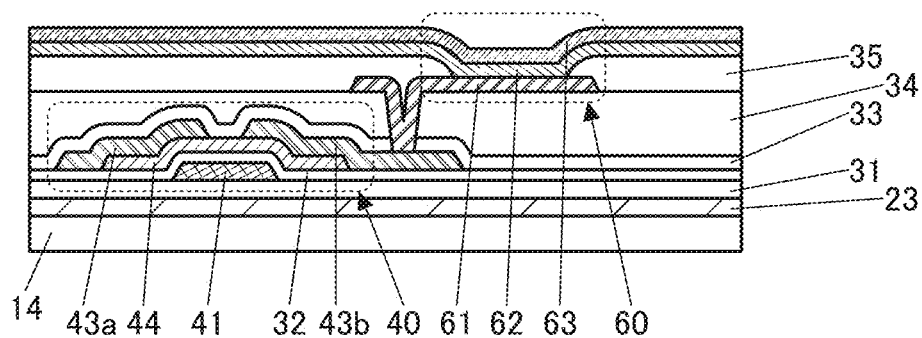
FIGS. 8A to 8C illustrate an example of a manufacturing method of a flexible device.

First, components from the resin layer 23 to the display element 60 are formed in order over the formation substrate 14 in a manner similar to that in the manufacturing method example 1 (FIG. 8A).

Figure 8B:
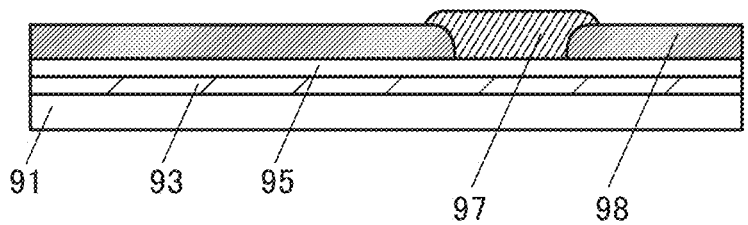

A resin layer 93 is formed over a formation substrate 91 using a photosensitive and thermosetting material (FIG. 8B).

The resin layer 93 has flexibility. The formation substrate 91 has lower flexibility than the resin layer 93 does. Since the resin layer 93 is formed over the formation substrate 91, the resin layer 93 can be transferred easily.

For the resin layer 93, a polyimide resin is preferably used. For the material and formation method of the resin layer 93, the description of the resin layer 23 can be referred to.

The resin layer 93 preferably has a thickness greater than or equal to 0.01 μm and less than 10 μm, further preferably greater than or equal to 0.1 μm and less than or equal to 5 μm, still further preferably greater than or equal to 0.1 μm and less than or equal to 3 μm, and yet still further preferably greater than or equal to 0.5 μm and less than or equal to 1 μm. With a solution having low viscosity, the resin layer 93 having a small thickness can be easily formed. By forming the resin layer 93 thin, the display device can be fabricated at low cost. The display device can be light-weight and thin. The display device can have higher flexibility. The thickness of the resin layer 93 is not limited thereto, and may be greater than or equal to 10 μm. For example, the resin layer 93 may have a thickness greater than or equal to 10 μm and less than or equal to 200 μm. The resin layer 93 having a thickness greater than or equal to 10 μm is favorable because the rigidity of the display device can be increased.

In the case where the resin layer 93 is positioned on the display surface side of the display device, the resin layer 93 preferably has a high visible-light transmitting property.

For the formation substrate 91, the description of the formation substrate 14 can be referred to.

Next, an insulating layer 95 is formed over the resin layer 93. Then, a coloring layer 97 and a light-blocking layer 98 are formed over the insulating layer 95 (FIG. 8B).

For the insulating layer 95, the description of the insulating layer 31 can be referred to.

A color filter or the like can be used as the coloring layer 97. The coloring layer 97 is provided to overlap with the display region of the display element 60.

A black matrix or the like can be used as the light-blocking layer 98. The light-blocking layer 98 is provided to overlap with the insulating layer 35.

Figure 8C:
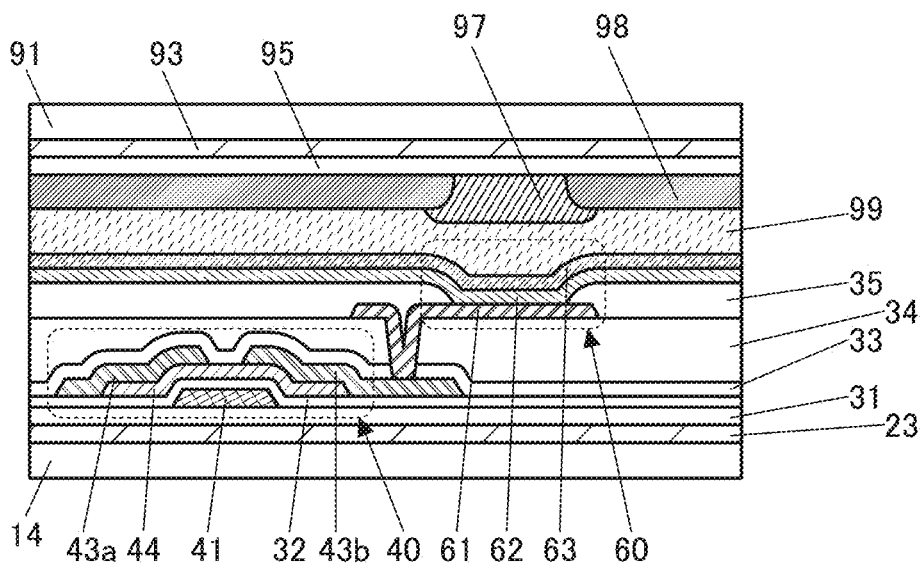

Next, a surface of the formation substrate 14 on which the resin layer 23 and the like are formed and a surface of the formation substrate 91 on which the resin layer 93 and the like are formed are attached to each other with a bonding layer 99 (FIG. 8C).

Figure 9A:
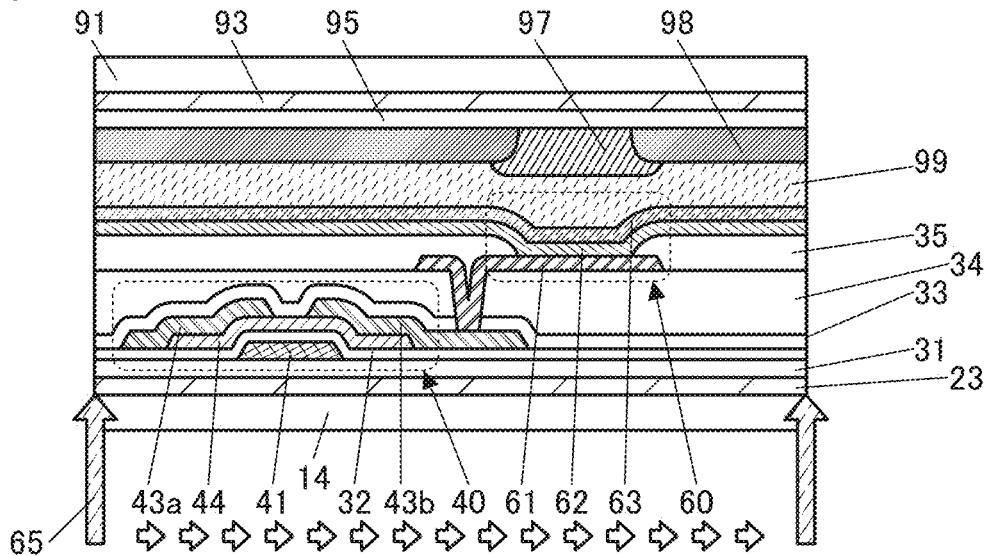
FIGS. 9A to 9C illustrate an example of a manufacturing method of a flexible device.

Next, the resin layer 23 is irradiated with the laser light 65 through the formation substrate 14 (FIG. 9A). Here, an example in which the formation substrate 14 is separated ahead of the formation substrate 91 is shown.

Figure 9B:
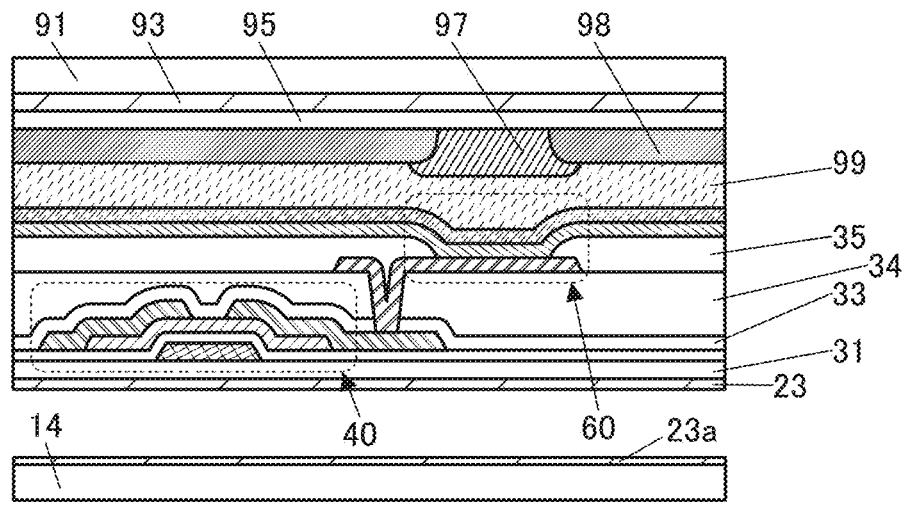
Figure 9C:
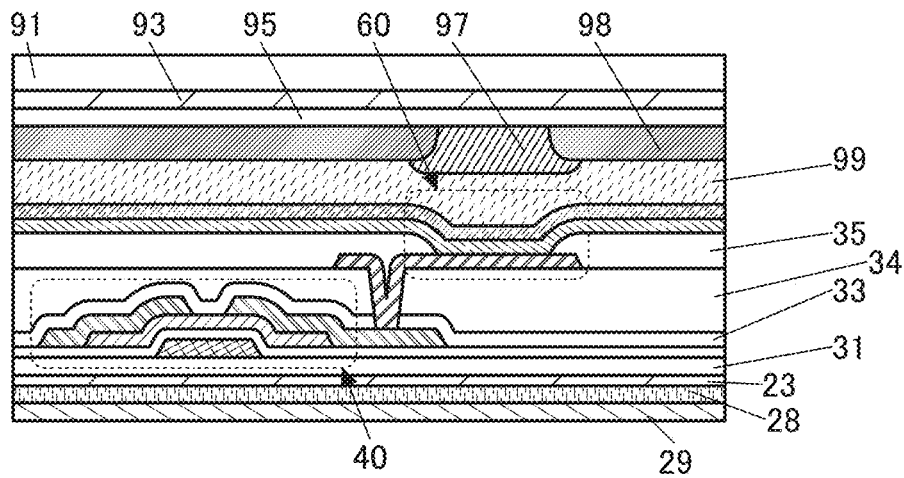

Then, the formation substrate 14 and the insulating layer 31 are separated from each other (FIG. 9B). FIG. 9B illustrates an example in which separation occurs in the resin layer 23. Part of the resin layer (resin layer 23*a*) remains over the formation substrate 14. The thickness of the resin layer 23 remaining on the insulating layer 31 side is reduced as compared with that in FIG. 9A. Then, the exposed resin layer 23 and the substrate 29 are attached to each other with the bonding layer 28 (FIG. 9C).

Figure 10A:
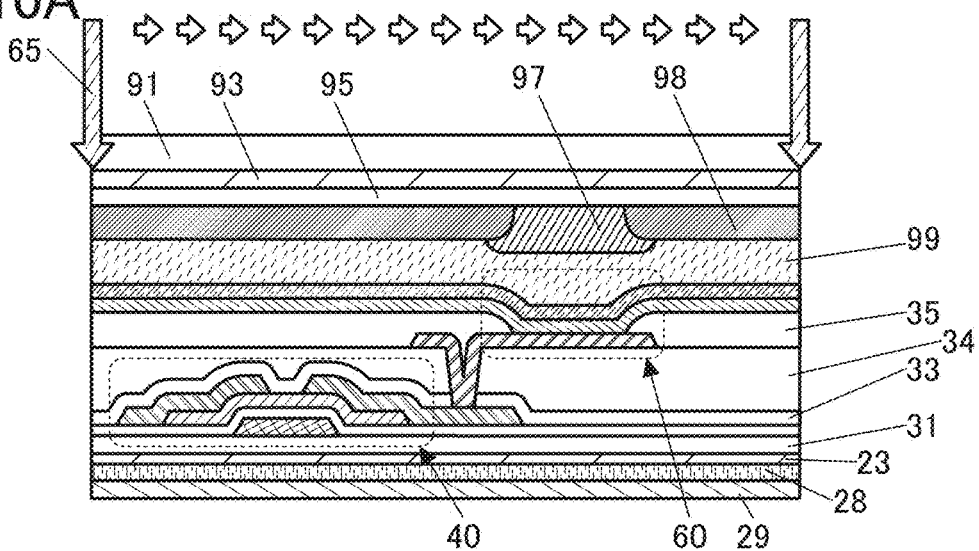
FIGS. 10A to 10C illustrate an example of a manufacturing method of a flexible device.

Next, the resin layer 93 is irradiated with the laser light 65 through the formation substrate 91 (FIG. 10A).

Figure 10B:
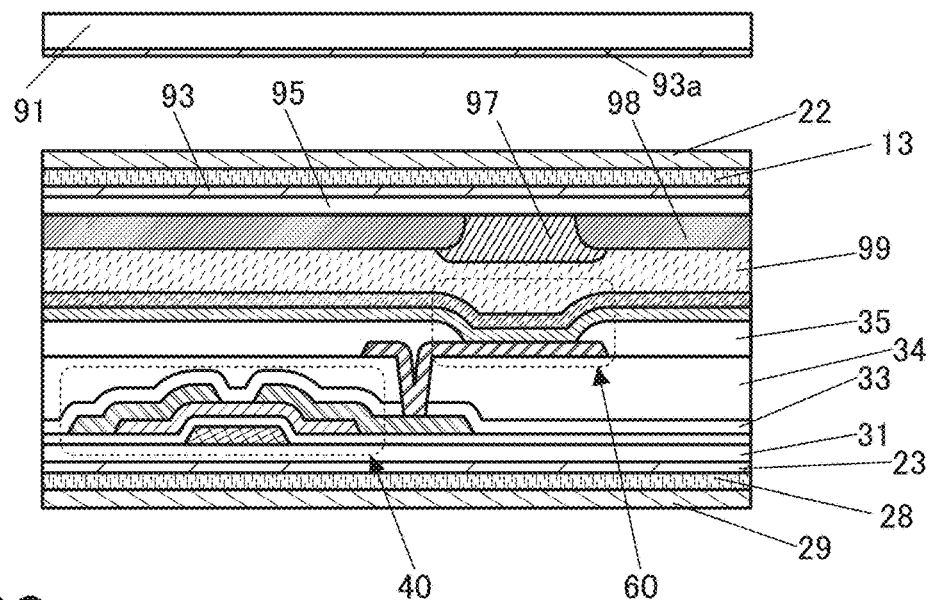

Then, the formation substrate 91 and the insulating layer 95 are separated from each other, and the exposed resin layer 93 and the substrate 22 are attached to each other with the bonding layer 13 (FIG. 10B). FIG. 10B illustrates an example in which separation occurs in the resin layer 93. Part of the resin layer (a resin layer 93*a*) remains over the formation substrate 91. The thickness of the resin layer 93 remaining on the insulating layer 95 side is reduced as compared with that in FIG. 10A.

In FIG. 10B, light emitted from the display element 60 is extracted to the outside of the display device through the coloring layer 97 and the resin layer 93. Thus, the resin layer 93 preferably has high visible-light transmittance. In the peeling method of one embodiment of the present invention, the thickness of the resin layer 93 can be reduced. Therefore, the visible-light transmittance of the resin layer 93 can be increased.

Figure 10C:
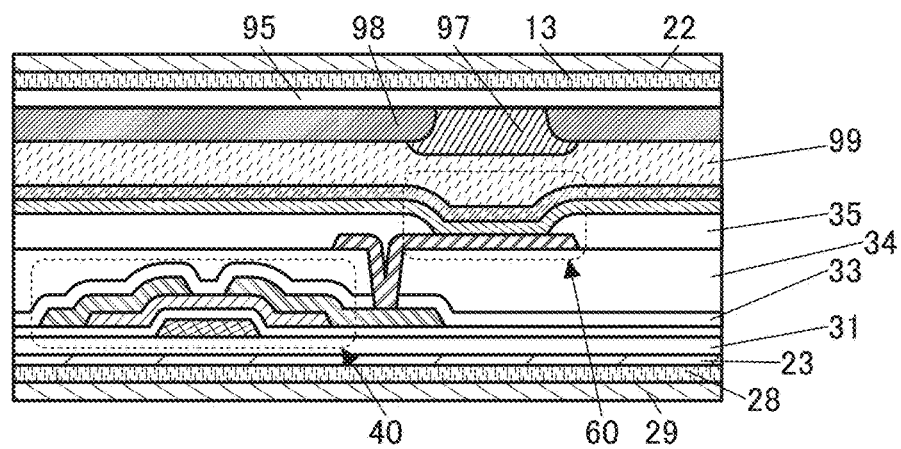

As illustrated in FIG. 10C, the resin layer 93 may be removed, and the substrate 22 may be attached to the insulating layer 95 with the bonding layer 13.

Through the above steps, the display device using an oxide semiconductor for the transistor and a color filter method can be fabricated.

The manufacturing method example 3 is an example in which the peeling method of one embodiment of the present invention is performed twice to fabricate a flexible device. In one embodiment of the present invention, each of the functional elements and the like included in the flexible device is formed over the formation substrate; thus, even in the case where a high-resolution display device is manufactured, high alignment accuracy of the flexible substrate is not required. It is thus easy to attach the flexible substrate.

As described in this embodiment, in the peeling method of one embodiment of the present invention, the fabrication process of the transistor can be performed at a low temperature. Furthermore, the resin layer can have a small thickness and low heat resistance. Thus, there are advantages in that the material of the resin layer can be selected from a wide range, high mass productivity can be obtained at low cost, and peeling and fabrication of a flexible device can be performed using a large-sized substrate, for example. Warpage of the flexible device due to the thickness of the resin layer can be suppressed in some cases.

Manufacturing Method Example 4

In the peeling method of one embodiment of the present invention, the resin layer is formed using the photosensitive material; thus, the resin layer with a desired shape can be easily formed.

For example, by forming an opening in the resin layer and disposing a conductive layer to cover the opening, an electrode part of which is exposed (also referred to as a rear electrode or a through electrode) can be formed after a peeling step to be described later. The electrode can be used as an external connection terminal.

In the manufacturing method example 4, the external connection terminal is electrically connected to a circuit board such as a flexible printed circuit (FPC) through the opening formed in the resin layer.

Figure 11A:
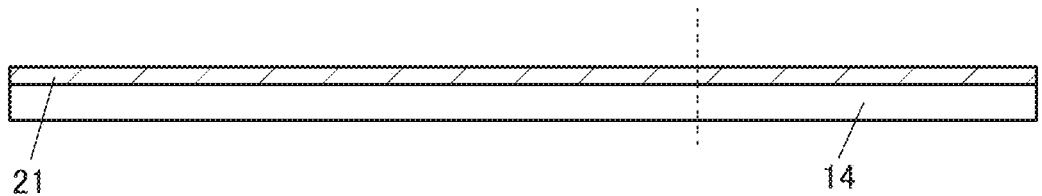
FIGS. 11A to 11E illustrate an example of a manufacturing method of a flexible device.

First, a film 21 to be the resin layer 23 is formed over the formation substrate 14 using a photosensitive and thermosetting material (FIG. 11A).

Specifically, the photosensitive and thermosetting material is deposited to a thickness greater than or equal to 0.1 μm and less than or equal to 3 μm.

Next, a solvent is removed by heat treatment and then light exposure is performed using a photomask. After that, development is performed to process the film 21 into a desired shape.

Figure 11B:
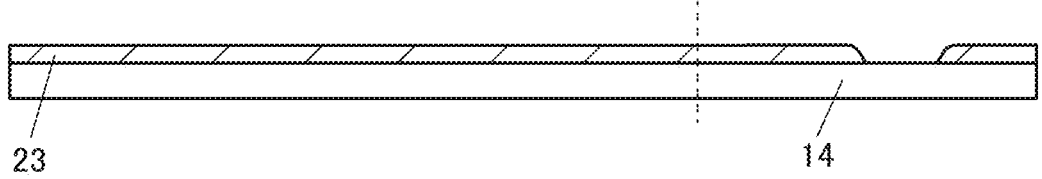
Figure 12A:
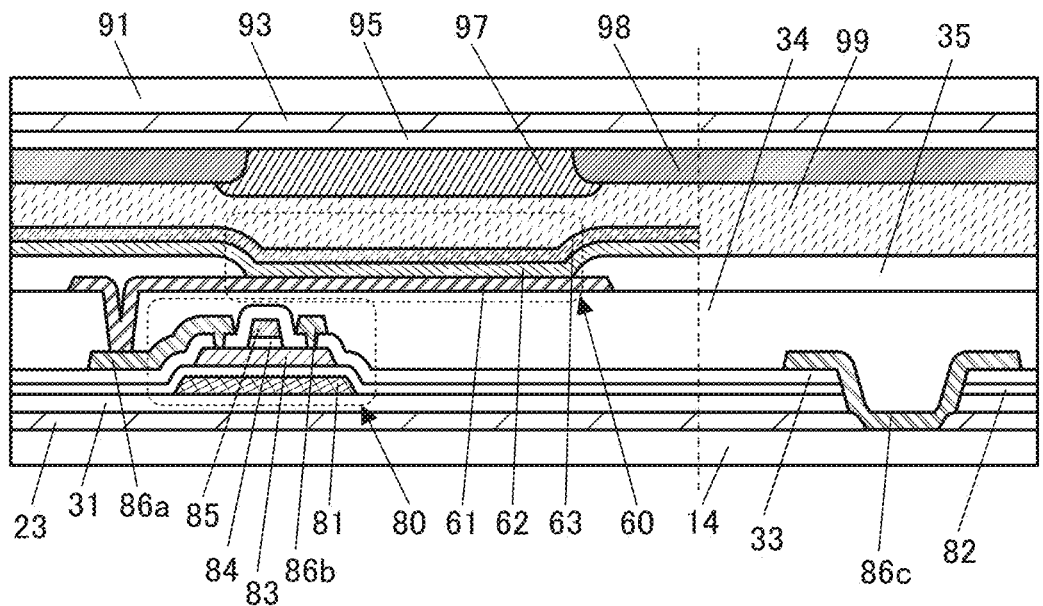
FIGS. 12A and 12B illustrate an example of a manufacturing method of a flexible device.
Figure 12B:
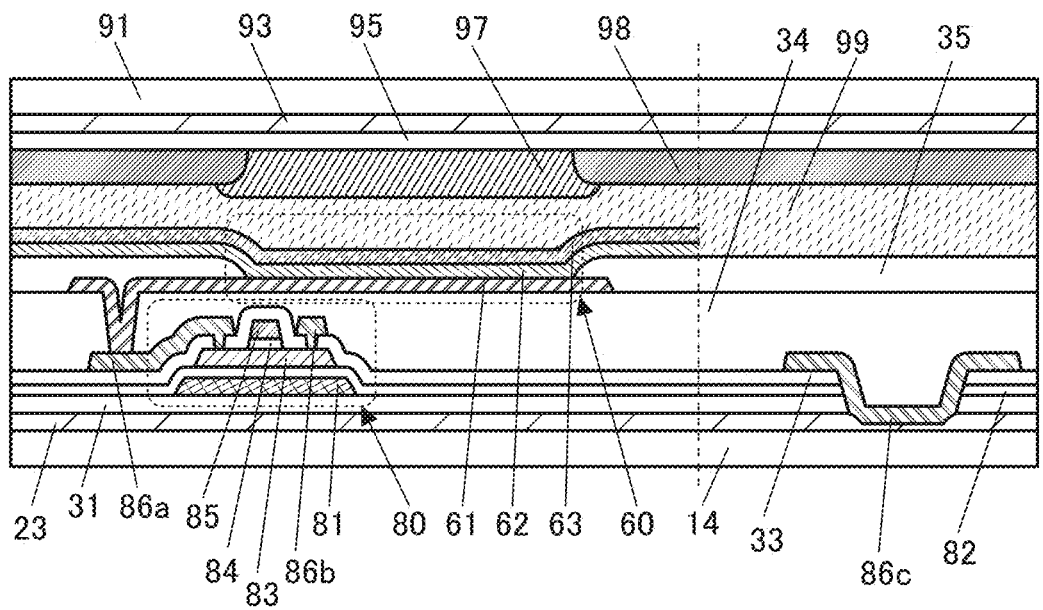

For example, FIG. 11B illustrates an example of forming an opening in the resin layer 23. Note that FIG. 12B illustrates an example in which a first region and a second region which is thinner than the first region are provided in the resin layer 23.

Next, the film 21 processed into a desired shape is heated, whereby the resin layer 23 is formed (FIG. 11B). It is particularly preferable that the film 21 be heated at a temperature higher than or equal to the formation temperature of each layer formed over the resin layer 23. For example, in the case where the formation temperature of the transistor is below 350° C., the film 21 to be the resin layer 23 is preferably heated at a temperature higher than or equal to 350° C. and lower than or equal to 450° C., further preferably higher than or equal to 350° C. and lower than or equal to 400° C., still further preferably higher than or equal to 350° C. and lower than 400° C., and yet still further preferably higher than or equal to 350° C. and lower than 375° C. Thus, a gas released from the resin layer 23 in the fabrication process of the transistor can be significantly reduced.

Next, the insulating layer 31 is formed over the resin layer 23. Then, a transistor 80 is formed over the insulating layer 31.

Here, the case where a transistor including the oxide semiconductor layer 44 and two gates is formed as the transistor 80 is described.

The transistor 80 is formed at a temperature lower than or equal to the allowable temperature limit of the resin layer 23. The transistor 80 is preferably formed at a temperature lower than or equal to the heating temperature in the above-described heating step of the resin layer 23.

Specifically, first, a conductive layer 81 is formed over the insulating layer 31. The conductive layer 81 can be formed in the following manner: a conductive film is formed, a resist mask is formed, the conductive film is etched, and the resist mask is removed.

Next, an insulating layer 82 is formed. For the insulating layer 82, the description of the inorganic insulating film that can be used for the insulating layer 31 can be referred to.

Then, an oxide semiconductor layer 83 is formed. The oxide semiconductor layer 83 can be formed in the following manner: an oxide semiconductor film is formed, a resist mask is formed, the oxide semiconductor film is etched, and the resist mask is removed. For the oxide semiconductor layer 83, the description of the material that can be used for the oxide semiconductor layer 44 can be referred to.

Then, an insulating layer 84 and a conductive layer 85 are formed. For the insulating layer 84, the description of the inorganic insulating film that can be used for the insulating layer 31 can be referred to. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Figure 11C:
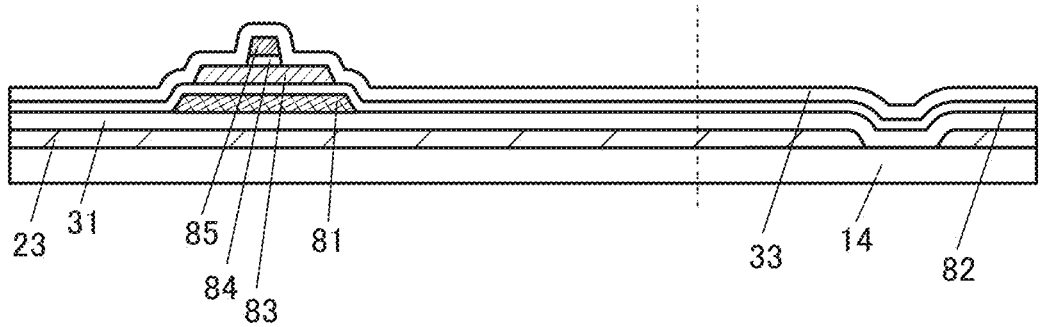

Next, the insulating layer 33 that covers the oxide semiconductor layer 83, the insulating layer 84, and the conductive layer 85 is formed (FIG. 11C). The insulating layer 33 can be formed in a manner similar to that of the insulating layer 31.

Figure 11D:
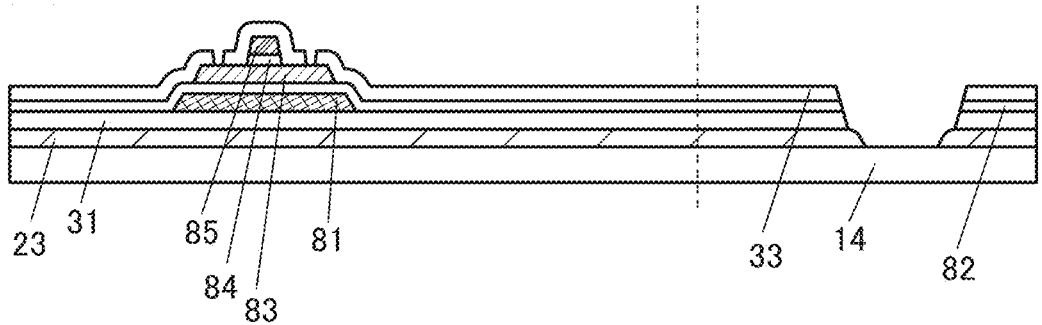

Here, the insulating layer 31, the insulating layer 82, and the insulating layer 33 each include an opening in a region overlapping with the opening of the resin layer 23 (FIG. 11D). The opening in a plurality of layers may be formed at a time or may be formed in each layer.

Figure 11E:
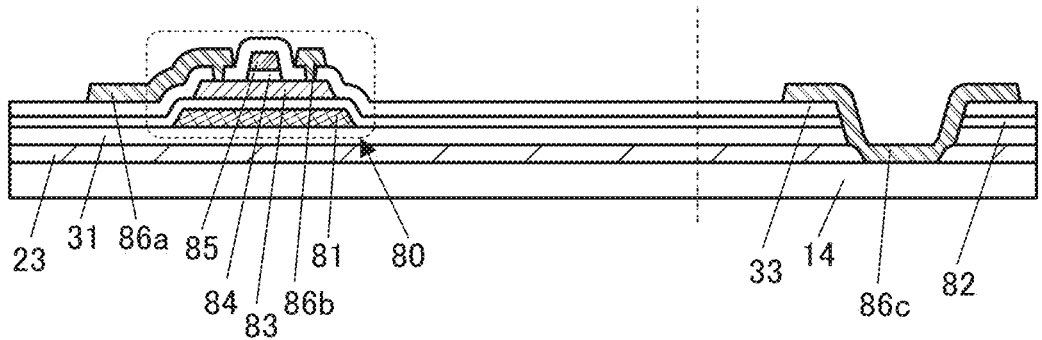

Next, a conductive layer 86a, a conductive layer 86b, and a conductive layer 86c are formed (FIG. 11E). The conductive layers 86a, 86b, and 86c can be formed in the following manner: a conductive film is formed, a resist mask is formed, the conductive film is etched, and the resist mask is removed.

In the above manner, the transistor 80 can be formed. In the transistor 80, part of the conductive layer 81 functions as a gate, part of the insulating layer 84 functions as a gate insulating layer, part of the insulating layer 82 functions as a gate insulating layer, and part of the conductive layer 85 functions as a gate. The oxide semiconductor layer 83 includes a channel region and a low-resistance region. The channel region overlaps with the conductive layer 85 with the insulating layer 84 provided therebetween. The low-resistance region includes a region connected to the conductive layer 86a and a region connected to the conductive layer 86b.

Next, components from the insulating layer 34 to the display element 60 are formed over the insulating layer 33. For these steps, the manufacturing method example 1 can be referred to.

In a manner similar to that in the manufacturing method example 3, the resin layer 93, the insulating layer 95, the coloring layer 97, and the light-blocking layer 98 are formed over the formation substrate 91.

Next, a surface of the formation substrate 14 on which the resin layer 23 and the like are formed and a surface of the formation substrate 91 on which the resin layer 93 and the like are formed are attached to each other with the bonding layer 99. FIGS. 12A and 12B are schematic cross-sectional views illustrating this state.

FIGS. 12A and 12B are different from each other only in the structure of the resin layer 23. FIG. 12A is an example in which the resin layer 23 has an opening and the conductive layer 86c is in contact with the formation substrate 14. FIG. 12B is an example in which the resin layer 23 includes the first region and the second region which is thinner than the first region and the conductive layer 86c overlaps with the second region.

The following steps are described using the structure illustrated in FIG. 12B as an example.

Next, the resin layer 23 is irradiated with laser light through the formation substrate 14. Here, an example in which the formation substrate 14 is separated ahead of the formation substrate 91 is shown.

Figure 13A:
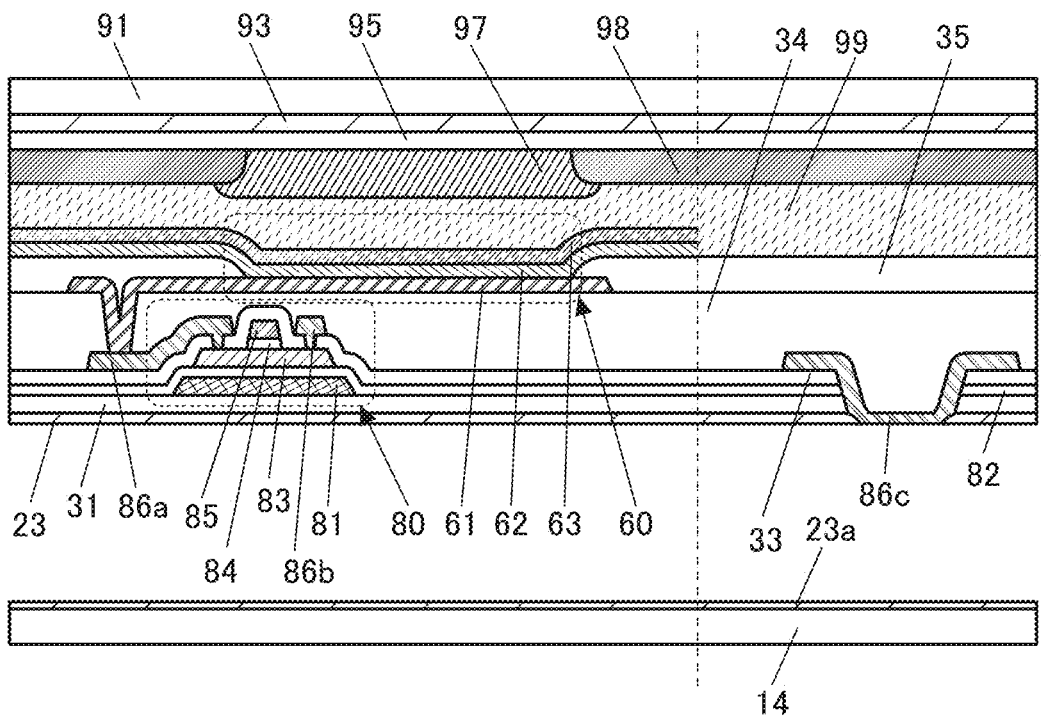
FIGS. 13A and 13B illustrate an example of a manufacturing method of a flexible device.

Then, the formation substrate 14 and the insulating layer 31 are separated from each other (FIG. 13A). FIG. 13A illustrates an example in which separation occurs in the resin layer 23. Part of the resin layer (resin layer 23a) remains over the formation substrate 14. The thickness of the resin layer 23 remaining on the insulating layer 31 side is reduced as compared with that in FIG. 12B. The second region (a region thinner than other regions) of the resin layer 23 is entirely positioned on the formation substrate 14 side. Therefore, the conductive layer 86c is exposed.

In the case where the resin layer 23 remains over the conductive layer 86c, the resin layer 23 is preferably removed by ashing or the like. Alternatively, in the case where the conductive layer 86c can be electrically connected to an FPC without removing the resin layer 23, for example, the resin layer 23 is not necessarily removed.

Then, the exposed resin layer 23 and the substrate 29 are attached to each other with the bonding layer 28. Note that the substrate 29 and the bonding layer 28 are provided in a position that does not overlap with the conductive layer 86c.

Next, the resin layer 93 is irradiated with laser light through the formation substrate 91. Then, the formation substrate 91 and the insulating layer 95 are separated from each other. Then, the exposed resin layer 93 and the substrate 22 are attached to each other with the bonding layer 13.

Figure 13B:
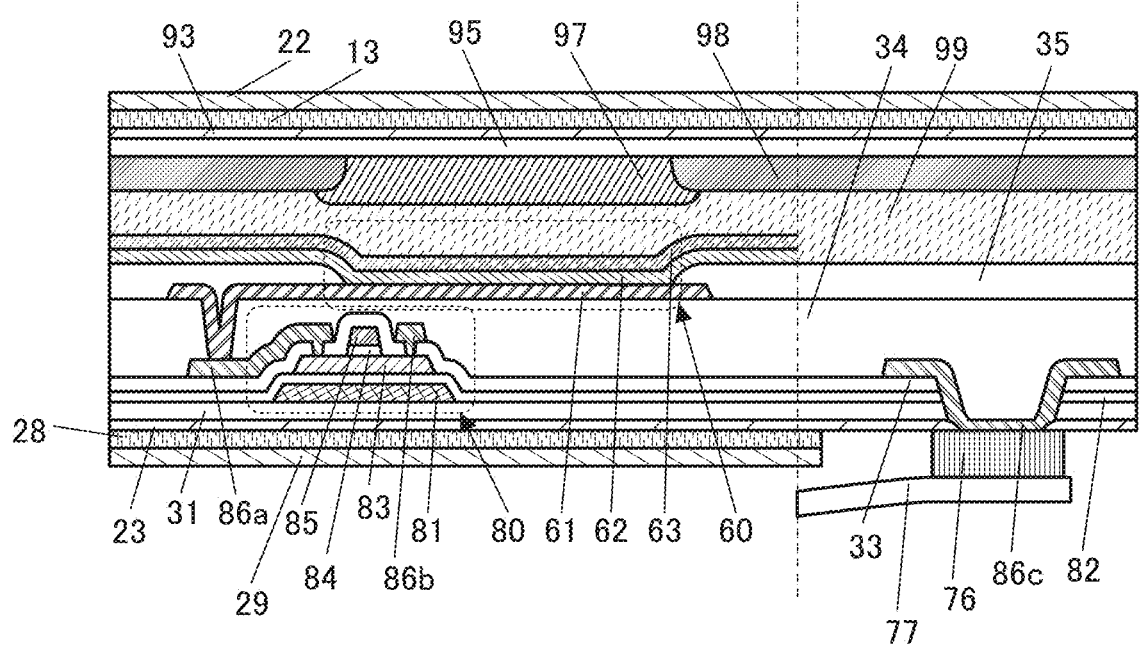

Then, the conductive layer 86c and an FPC 77 are electrically connected to each other through a connector 76 (FIG. 13B).

As the connector 76, any of various anisotropic conductive films (ACF), anisotropic conductive pastes (ACP), and the like can be used.

In this embodiment, an example using a top-emission light-emitting element is shown. In the case where the conductive layer 86c is exposed from the substrate 22 side and electrically connected to the FPC 77, the display region cannot overlap with the FPC 77 because the substrate 22 is on the display surface side, and thus a region of the display device that overlaps with the FPC 77 is limited. In contrast, in one embodiment of the present invention, the conductive layer 86c can be exposed from the side opposite to the display surface with the use of the photosensitive material for the resin layer 23. Therefore, the FPC 77 can be provided to overlap with the display region and the space of an electronic device can be saved.

This embodiment can be combined with any of the other embodiments as appropriate.

Embodiment 2

In this embodiment, a flexible device of one embodiment of the present invention will be described with reference to FIGS. 14A and 14B, FIGS. 15A to 15E, FIGS. 16A and 16B, FIG. 17, FIG. 18, and FIGS. 19A and 19B.

In this embodiment, an example in which an active matrix organic EL display device is fabricated as the flexible device will be described. With the use of a flexible material for a substrate, the display device can be a foldable organic EL display device. Moreover, one embodiment of the present invention is not limited to the light-emitting device or the display device including an organic EL element and can be applied to a variety of devices such as a light-emitting device and a display device including another light-emitting element or a display element, a semiconductor device, and an input/output device.

One embodiment of the present invention is a display device including a resin layer, a transistor over the resin layer, and a display element electrically connected to the transistor.

An oxide semiconductor is used for a channel formation region of a transistor in one embodiment of the present invention. As described in Embodiment 1, with the use of an oxide semiconductor, the maximum manufacturing process temperature of the display device can be lowered, the manufacturing cost of the display device can be reduced, and the manufacturing process of the display device can be simplified, as compared with the case of using LTPS.

In one embodiment of the present invention, the resin layer has a thickness greater than or equal to 0.1 µm and less than or equal to 3 µm. By forming the resin layer thin, the display device can be fabricated at low cost. The display device can be light-weight and thin. The display device can have higher flexibility.

The heat resistance of the resin layer can be measured by, for example, a weight loss percentage due to heat, specifically, the 5% weight loss temperature. In one embodiment of the present invention, the 5% weight loss temperature of the resin layer can be lower than or equal to 450° C., lower than or equal to 400° C., lower than 400° C., or lower than 350° C., for example.

In one embodiment of the present invention, a resin layer is formed using a photosensitive material. With the photosensitive material, a resin layer with a desired shape can be easily formed. For example, a resin layer having an opening or a resin layer having two or more regions with different thicknesses can be easily formed. Accordingly, the resin layer can be prevented from hindering formation of a back gate, an external connection terminal, a through electrode, or the like.

Structures of a display device of one embodiment of the present invention will be specifically described below. Note that Embodiment 1 can also be referred to for a material that can be used for the display device of this embodiment and a manufacturing method of the display device.

Structure Example 1

Figure 14A:
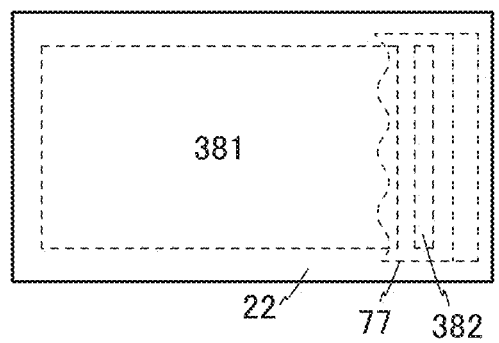
FIGS. 14A and 14B illustrate an example of a flexible device.
Figure 14B:
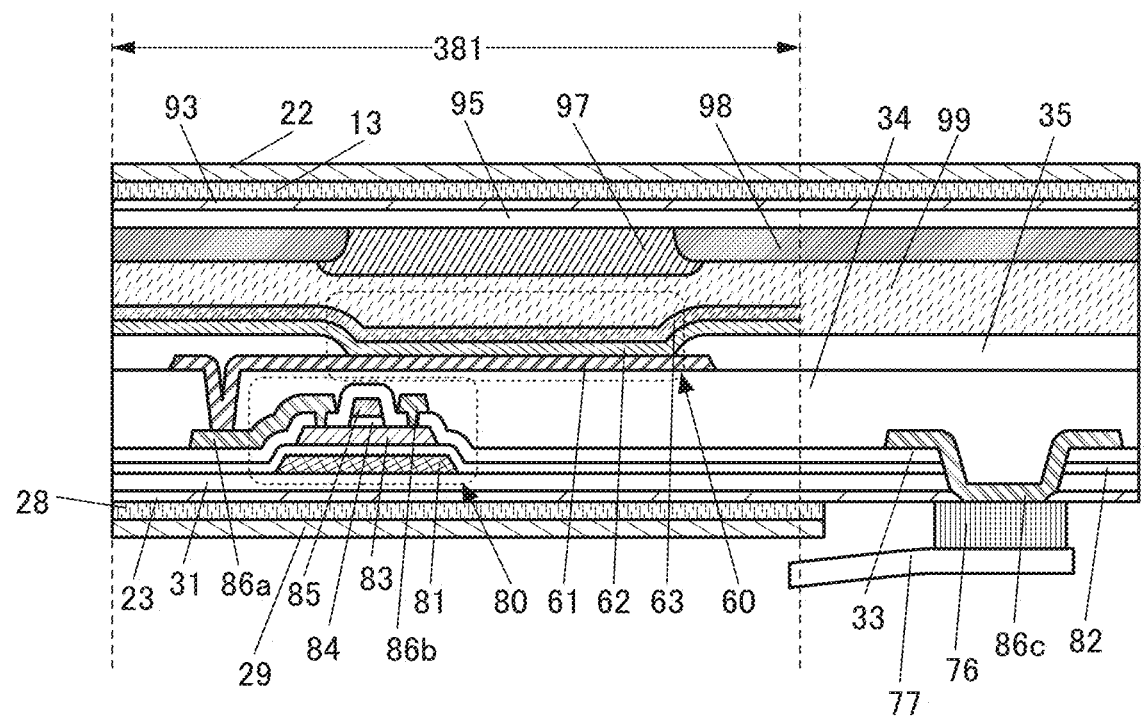

FIG. 14A is a top view of a display device. FIG. 14B is a cross-sectional view of a display portion 381 of the display device and a cross-sectional view of a connection portion for connection to the FPC 77.

The display device in FIGS. 14A and 14B includes a pair of substrates (the substrate 22 and the substrate 29). The substrate 22 side corresponds to a display surface side. The display device includes the display portion 381 and a driver circuit portion 382. The FPC 77 is attached to the display device.

The display device in FIG. 14B is a top-emission display device using a color filter method.

The display device in FIG. 14B includes the substrate 29, the bonding layer 28, the resin layer 23, the insulating layer 31, the transistor 80, the conductive layer 86c, the insulating layer 33, the insulating layer 34, the insulating layer 35, the display element 60, the bonding layer 99, the coloring layer 97, the light-blocking layer 98, the substrate 22, the bonding layer 13, the resin layer 93, and the insulating layer 95.

The display device in FIG. 14B can be manufactured by referring to the manufacturing method example 3 and the manufacturing method example 4 in Embodiment 1.

The display portion 381 includes the transistor 80.

The transistor 80 includes the conductive layer 81, the insulating layer 82, the oxide semiconductor layer 83, the insulating layer 84, the conductive layer 85, and the conductive layers 86a and 86b. The conductive layer 81 and the conductive layer 85 each function as a gate. The insulating layer 82 and the insulating layer 84 each function as a gate insulating layer. The conductive layer 81 overlaps with the oxide semiconductor layer 83 with the insulating layer 82 provided therebetween. The conductive layer 85 overlaps with the oxide semiconductor layer 83 with the insulating layer 84 provided therebetween. One of the conductive layers 86a and 86b is electrically connected to a source region of the oxide semiconductor layer 83 and the other is electrically connected to a drain region of the oxide semiconductor layer 83.

Here, as described above, since an oxide semiconductor is used for a channel formation region of a transistor in one embodiment of the present invention, the resin layer 23 is not required to have high heat resistance and a large thickness. Therefore, the resin layer 23 can be thin. Accordingly, the display device can be fabricated at low cost. The display device can be light-weight and thin. The display device can have higher flexibility. The same applies to the resin layer 93.

The resin layer 23 and the resin layer 93 each preferably have a thickness greater than or equal to 0.01 µm and less than 10 µm, further preferably greater than or equal to 0.1 µm and less than or equal to 3 µm, and still further preferably greater than or equal to 0.5 µm and less than or equal to 1 µm.

It is preferable that at least one of the insulating layer 33 and the insulating layer 34 be formed using a material through which impurities such as water and hydrogen are hardly diffused. Diffusion of impurities from the outside into the transistor can be effectively inhibited, leading to improved reliability of the display device. The insulating layer 34 functions as a planarization layer.

In this embodiment, an example in which a light emitting element is used as the display element 60 is described. The display element 60 includes the conductive layer 61, the EL layer 62, and the conductive layer 63. The display element 60 emits light to the coloring layer 97 side.

The transistor, the capacitor, the wiring, and the like are positioned so as to overlap with a light-emitting region of the light-emitting element; accordingly, the aperture ratio of the display portion 381 can be increased.

One of the conductive layer 61 and the conductive layer 63 functions as an anode and the other functions as a cathode. When a voltage higher than the threshold voltage of the light-emitting element is applied between the conductive layer 61 and the conductive layer 63, holes are injected to the EL layer 62 from the anode side and electrons are injected to the EL layer 62 from the cathode side. The injected electrons and holes are recombined in the EL layer 62 and a light-emitting substance contained in the EL layer 62 emits light.

The conductive layer 61 is electrically connected to a source or a drain of the transistor 80 directly or through a conductive layer. The conductive layer 61 functioning as a pixel electrode is provided for each light-emitting element. Two adjacent conductive layers 61 are electrically insulated from each other by the insulating layer 35.

The EL layer 62 contains a light-emitting substance. As the light-emitting element 304, an organic EL element including an organic compound as a light-emitting material can be favorably used.

The EL layer 62 includes at least one light-emitting layer. In addition to the light-emitting layer, the EL layer 62 can further include a layer containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer 62, and an inorganic compound may also be included.

The conductive layer 63 functioning as a common electrode is shared by a plurality of light-emitting elements. A fixed potential is supplied to the conductive layer 63.

Here, the display element 60 is preferably positioned within 10 μm, further preferably 5 μm, and still further preferably 2.5 μm, from a neutral plane.

A region having low adhesion may be generated in the display element 60 in the case where an EL element is used for the display element 60, for example. Stress applied to the display element 60 can be reduced by arranging the display element 60 in a position closer to the neutral plane. In addition, in a peeling step in manufacturing a display device or at the use of the display device by being bent, for example, occurrence of film separation can be suppressed.

The display element 60 overlaps with the coloring layer 97 with the bonding layer 99 provided therebetween. The insulating layer 35 overlaps with the light-blocking layer 98 with the bonding layer 99 provided therebetween.

The coloring layer 97 is a coloring layer that transmits light in a specific wavelength range. For example, a color filter for transmitting light in a red, green, blue, or yellow wavelength range can be used. Examples of materials that can be used for the coloring layer 97 include a metal material, a resin material, and a resin material containing a pigment or dye.

Note that one embodiment of the present invention is not limited to a color filter method, and a separate coloring method, a color conversion method, a quantum dot method, and the like may be employed.

The light-blocking layer 98 is provided between the adjacent coloring layers 97. The light-blocking layer 98 blocks light emitted from an adjacent light-emitting element to inhibit color mixture between adjacent light-emitting elements. Here, the coloring layer 97 is provided such that its end portion overlaps with the light-blocking layer 98, whereby light leakage can be reduced. For the light-blocking layer 98, a material that blocks light emitted from the light-emitting element can be used. For example, a black matrix can be formed using a metal material or a resin material containing pigment or dye. Note that it is preferable to provide the light-blocking layer 98 in a region other than the display portion 381, such as the driver circuit portion 382, in which case undesired leakage of guided light or the like can be inhibited.

The resin layer 23 and the substrate 29 are attached to each other with the bonding layer 28. In addition, the resin layer 93 and the substrate 22 are attached to each other with the bonding layer 13.

The insulating layer 95 and the insulating layer 31 are preferably highly resistant to moisture. The display element 60, the transistor 80, and the like are preferably provided between a pair of insulating layers which are highly resistant to moisture, in which case impurities such as water can be prevented from entering these elements, leading an increase in the reliability of the display device.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], and still further preferably lower than or equal to $1\times10^{-8}$ [g/(m$^2$·day)].

The conductive layer 86c can be formed using the same material and the same fabrication step as the conductive layer included in the transistor. For example, the conductive layer 86c can be formed using the same material and the same fabrication step as the conductive layers 86a and 86b. The conductive layer 86c is electrically connected to an external input terminal through which a signal and a potential from the outside is transmitted to the driver circuit portion 382. Here, an example in which the FPC 77 is provided as the external input terminal is described. The FPC 77 is electrically connected to the conductive layer 86c through the connector 76.

As described above, the resin layer 23 can be formed using a photosensitive material. Therefore, the conductive layer 86c and the FPC 77 can be electrically connected to each other through the opening provided in the resin layer 23. Such a structure allows the FPC 77 to be positioned on the side opposite to the display surface. Thus, a space for bending the FPC 77 in incorporating the display device in an electronic device can be saved, which enables the electronic device to be smaller.

Note that the structure of the display device of one embodiment of the present invention is not limited to the structure in FIG. 14A. FIGS. 15A to 15E are each a top view of a display device including the pair of substrates (the substrate 22 and the substrate 29). Each display device includes one display portion 381 and one or more driver circuit portions 382. The FPC 77 is connected to the display device. The FPC 77 is electrically connected to an external connection electrode (not illustrated) over the substrate 29.

Figure 15A:
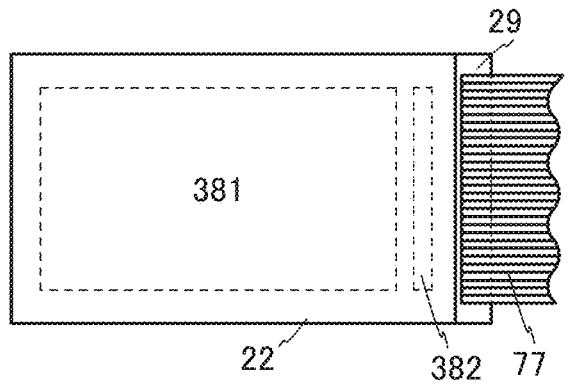
FIGS. 15A to 15E each illustrate an example of a flexible device.

In the display device illustrated in FIG. 15A, the driver circuit portion 382 is provided on one side. The display device in FIG. 15A is different from the display device in FIG. 14A in that the FPC 77 is attached to the display surface side.

Figure 15B:
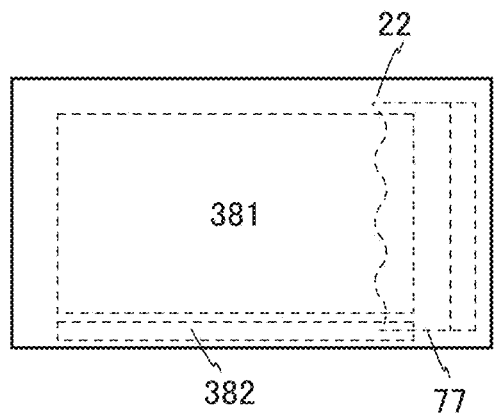

In the display device illustrated in FIG. 15B, the driver circuit portion 382 is provided on one side. In the display device in FIG. 14A, the driver circuit portion 382 is provided along a short side of the display portion 381, whereas in the display device in FIG. 15B, the driver circuit portion 382 is provided along a long side of the display portion 381.

Figure 15C:
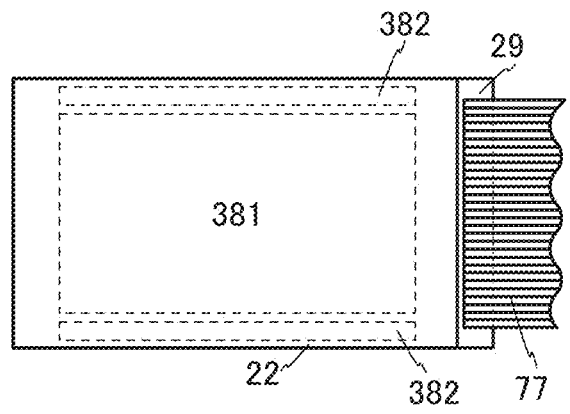
Figure 15D:
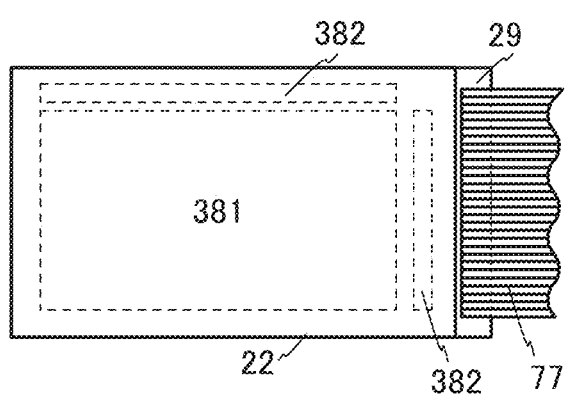

In each of the display devices illustrated in FIGS. 15C and 15D, the driver circuit portion 382 is provided on two sides. In FIG. 15C, the driver circuit portions 382 are provided along the opposite sides. In FIG. 15D, the driver circuit portions 382 are provided along a short side and a long side of the display device.

Figure 15E:
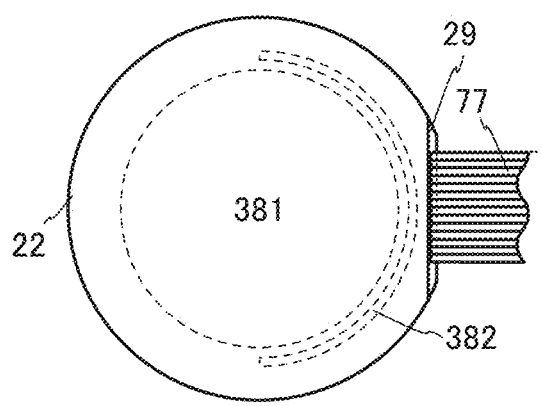

FIG. 15E is an example of the display device in which the top surface shape of the display portion 381 is circular. The display portion 381 does not necessarily have a polygonal top surface shape and may have any of a variety of top surface shapes such as circular and elliptical shapes.

The display device does not necessarily have a polygonal top surface shape and may have any of a variety of top surface shapes such as circular and elliptical shapes. The display device in FIG. 15E has a top surface shape including both a curved portion and a linear portion.

Structure Example 2

FIGS. 16A and 16B, FIG. 17, and FIG. 18 are cross-sectional views each illustrating a display portion 381 of a display device, which is different from the display portion 381 in FIG. 14B. In the structure example below, components similar to those in the above structure example 1 will not be described in some cases. The cross-sectional view in FIG. 17 also illustrates a connection portion for connection to the FPC 77.

The display devices in FIGS. 16A and 16B, FIG. 17, and FIG. 18 are each a top-emission display device using a color filter method.

Figure 16A:
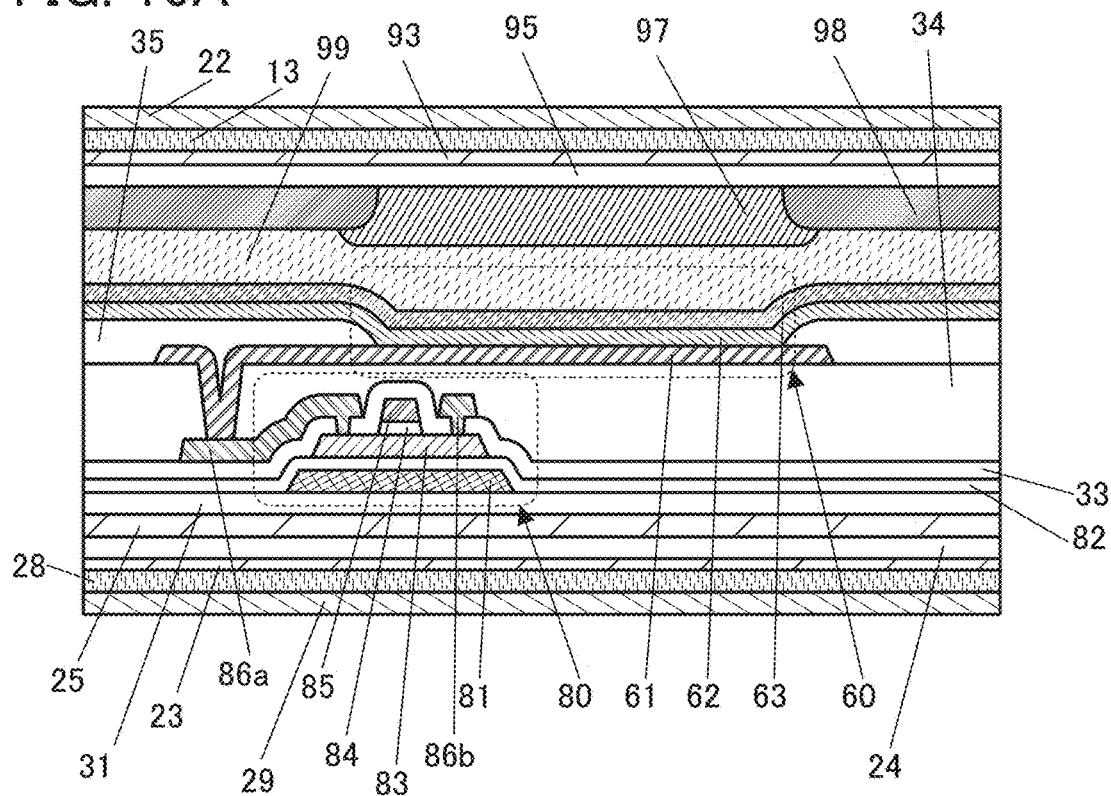
FIGS. 16A and 16B each illustrate an example of a flexible device.
Figure 16B:
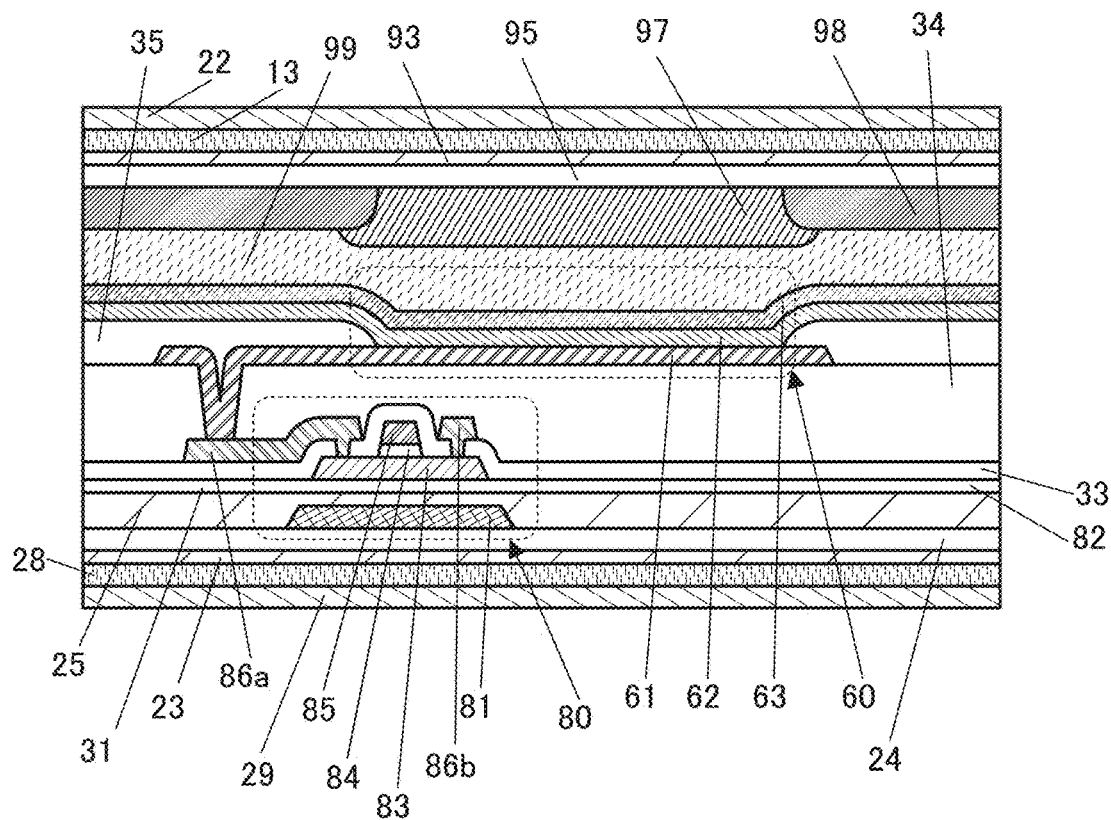

The display devices in FIGS. 16A and 16B each include the substrate 29, the bonding layer 28, the resin layer 23, an insulating layer 24, a resin layer 25, the insulating layer 31, the transistor 80, the insulating layer 33, the insulating layer 34, the insulating layer 35, the display element 60, the bonding layer 99, the coloring layer 97, the light-blocking layer 98, the substrate 22, the bonding layer 13, the resin layer 93, and the insulating layer 95.

The display devices in FIGS. 16A and 16B are each a display device in which the insulating layer 24 and the resin layer 25 are added to the components of FIG. 14B.

In FIG. 16B, the conductive layer 81 functioning as a gate of the transistor 80 is positioned between the insulating layer 24 and the resin layer 25.

The resin layer 25 is formed using a photosensitive material. With the photosensitive material, the resin layer 25 with a desired shape can be easily formed. Therefore, the conductive layer 81 can be electrically connected to another conductive layer through an opening, which is formed in the resin layer 25.

Since an oxide semiconductor is used for a channel formation region of the transistor, the resin layer 25 is not required to have high heat resistance and a large thickness. Therefore, the resin layer 25 can be thin. Accordingly, an electric field of the conductive layer 81 can be effectively applied to the oxide semiconductor layer 83. An electric field for inducing a channel can be effectively applied to the oxide semiconductor layer 83 by the conductive layer 81 and the conductive layer 85; thus, the current drive capability of the transistor 80 can be improved and high on-state current characteristics can be obtained.

The resin layer 25 preferably has a planarizing function because steps due to the conductive layer 81 are planarized and thus film formation in a later step can be easily performed.

In some cases, adhesion can be improved by providing the insulating layer 24 between the resin layer 23 and the resin layer 25 as compared to the case where the resin layer 23 and the resin layer 25 are provided in contact with each other.

Figure 17:
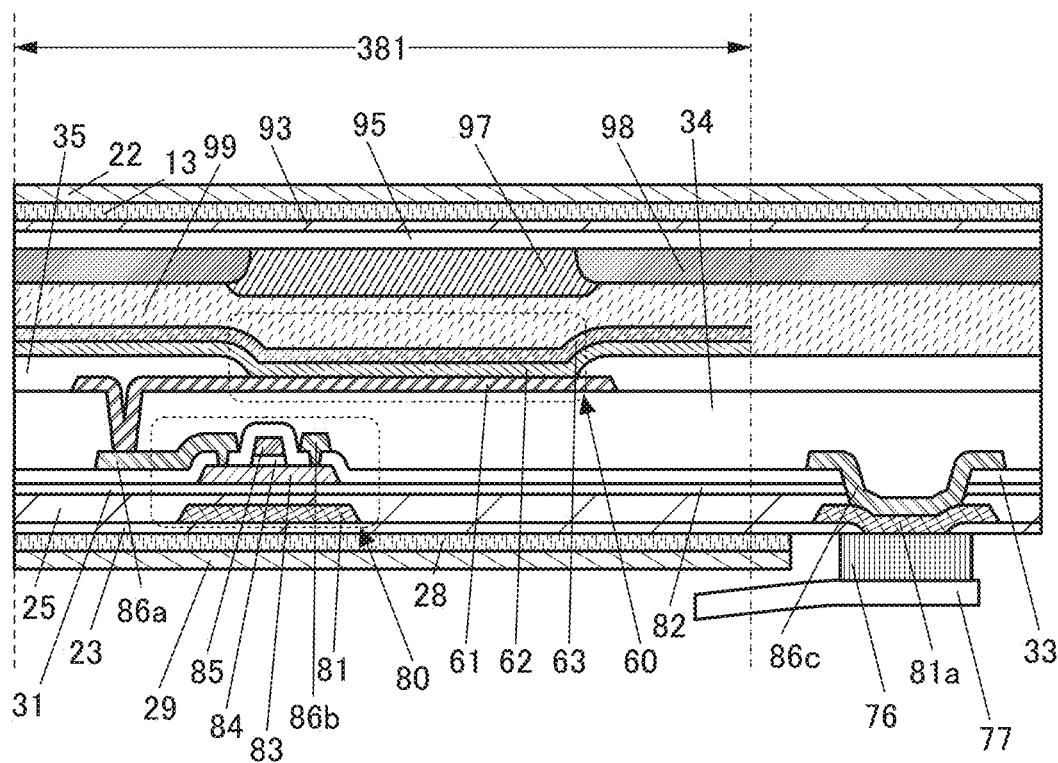
FIG. 17 illustrates an example of a flexible device.

The display device in FIG. 17 includes the substrate 29, the bonding layer 28, the resin layer 23, the resin layer 25, the transistor 80, a conductive layer 81a, the conductive layer 86c, the insulating layer 33, the insulating layer 34, the insulating layer 35, the display element 60, the bonding layer 99, the coloring layer 97, the light-blocking layer 98, the substrate 22, the bonding layer 13, the resin layer 93, and the insulating layer 95.

The display device in FIG. 17 is a display device in which the insulating layer 31 is removed from and the resin layer 25 is added to the components of FIG. 14B.

In FIG. 17, the conductive layer 81 functioning as a gate of the transistor 80 is positioned between the resin layer 23 and the resin layer 25.

In the manufacturing process of the display device, part of the resin layer 23 might be removed in processing a conductive film to be the conductive layer 81. In the case where the resin layer 23 is not a uniform film or in the case where a large opening is formed in the resin layer 23, the yield of peeling of the formation substrate might be decreased. The display device in FIG. 17 includes the resin layer 25 which is in contact with the resin layer 23 and the conductive layer 81. Therefore, the formation substrate can be peeled using the resin layer 25 in a portion from which the resin layer 23 is removed. Thus, the manufacturing yield of the display device can be increased.

The conductive layer 81a and the conductive layer 86c can be formed using the same material and the same fabrication step as the conductive layer included in the transistor. For example, the conductive layer 81a can be formed using the same material and the same fabrication step as the conductive layer 81. The FPC 77 is electrically connected to the conductive layer 86c through the conductive layer 81a and the connector 76.

Figure 18:
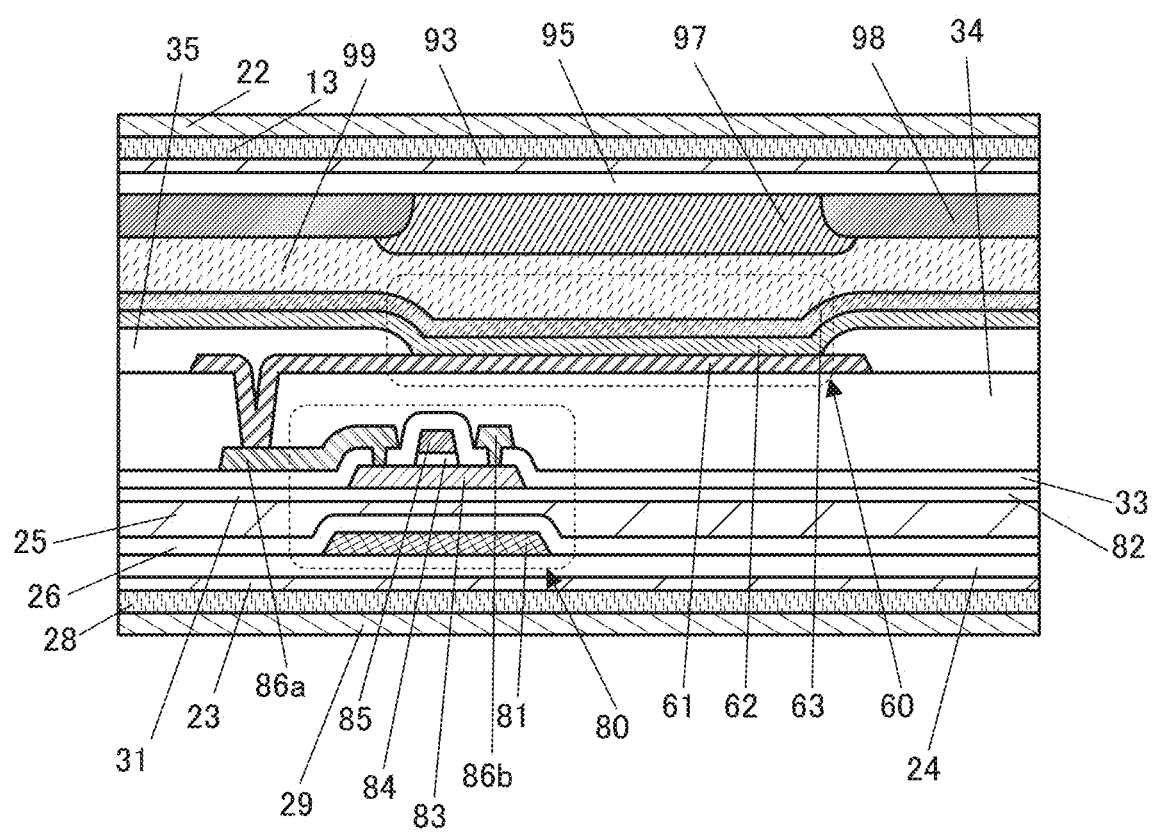
FIG. 18 illustrates an example of a flexible device.

The display device in FIG. 18 includes the substrate 29, the bonding layer 28, the resin layer 23, the insulating layer 24, the resin layer 25, an insulating layer 26, the transistor 80, the insulating layer 33, the insulating layer 34, the insulating layer 35, the display element 60, the bonding layer 99, the coloring layer 97, the light-blocking layer 98, the substrate 22, the bonding layer 13, the resin layer 93, and the insulating layer 95.

The display device in FIG. 18 is a display device in which the insulating layer 26 is added to the components of FIG. 16B.

In FIG. 18, the conductive layer 81 is surrounded by the insulating layer 24 and the insulating layer 26. For example, in the case where copper or the like is used for the conductive layer 81, the conductive layer 81 is preferably surrounded by the insulating layer 24 and the insulating layer 26 to prevent oxidation. A silicon nitride film is favorable for the insulating layer 24 and the insulating layer 26, for example.

Structure Example 3

Figure 19A:
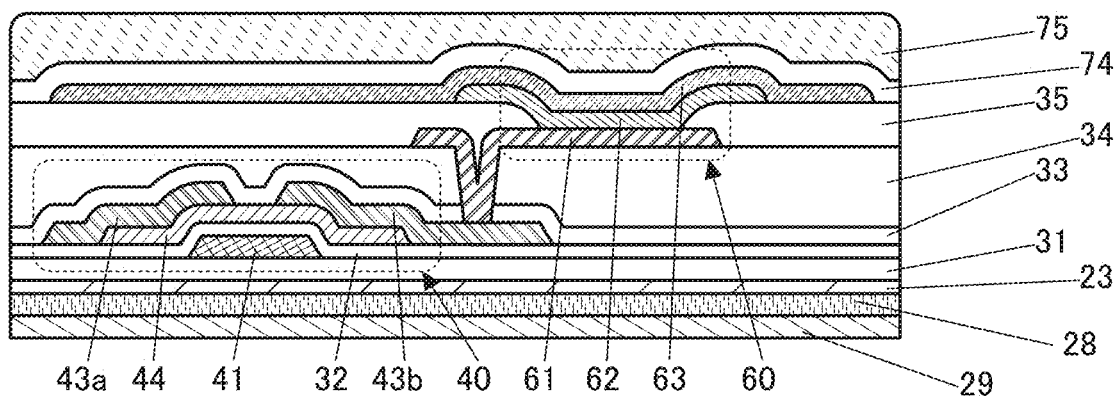
FIGS. 19A and 19B each illustrate an example of a flexible device.
Figure 19B:
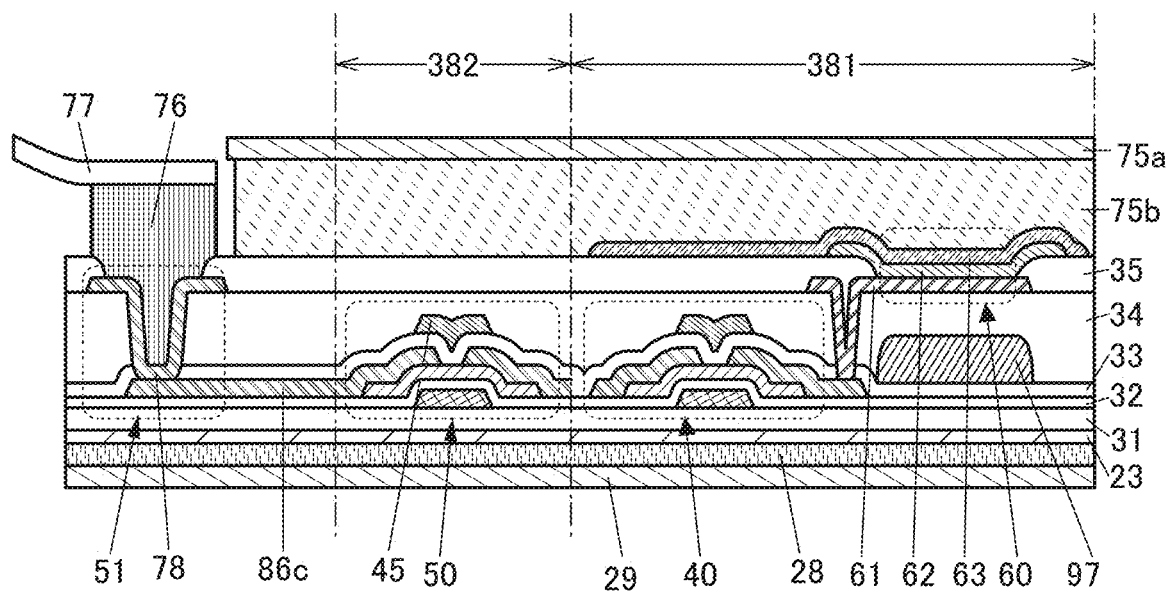

FIGS. 19A and 19B are each a cross-sectional view illustrating a display portion 381 of a display device. The cross-sectional view in FIG. 19B also illustrates the driver circuit portion 382 and a connection portion for connection to the FPC 77.

The display device in FIG. 19A is a bottom-emission, top-emission, or dual emission display device using a separate coloring method. The display device in FIG. 19B is a bottom-emission display device using a color filter method.

The display device in FIG. 19A includes the substrate 29, the bonding layer 28, the resin layer 23, the insulating layer 31, the transistor 40, the insulating layer 33, the insulating layer 34, the insulating layer 35, the display element 60, the insulating layer 74, and the protective layer 75.

The display device in FIG. 19A can be manufactured by referring to the manufacturing method example 1 and the manufacturing method example 2 in Embodiment 1.

The transistor 40 includes the conductive layer 41, the insulating layer 32, the oxide semiconductor layer 44, and the conductive layers 43a and 43b. The conductive layer 41 functions as a gate. The insulating layer 32 functions as a gate insulating layer. The conductive layer 41 overlaps with the oxide semiconductor layer 44 with the insulating layer 32 provided therebetween. The conductive layers 43a and 43b are connected to the oxide semiconductor layer 44. One of the conductive layers 43a and 43b functions as a source, and the other functions as a drain.

The insulating layer 74 functions as a protective layer that suppresses diffusion of impurities such as water into the display element 60. The display element 60 is sealed with the insulating layer 74.

The protective layer 75 can be used as a layer positioned on the outermost surface of the display device. The protective layer 75 preferably has a high visible-light transmitting property. A material that can be used for the resin layer 23 can be used for the protective layer 75.

The display device in FIG. 19B includes the substrate 29, the bonding layer 28, the resin layer 23, the insulating layer 31, the transistor 40, a transistor 50, the conductive layer 86c, a conductive layer 78, the insulating layer 33, the insulating layer 34, the insulating layer 35, the display element 60, the bonding layer 75b, the substrate 75a, and the coloring layer 97.

FIG. 19B is an example including the transistor 40 and the transistor 50 which are each a transistor in which a conductive layer 45 functioning as a gate is added to the components of the transistor 40 in FIG. 19A.

The display element 60 emits light to the coloring layer 97 side.

The conductive layer 78 can be formed using the same material and the same fabrication step as the conductive layer 61. The FPC 77 is electrically connected to the conductive layer 86c through the conductive layer 78 and the connector 76.

As illustrated in FIG. 19B, it is not necessary to electrically connect the conductive layer 86c to the FPC 77 through an opening in the resin layer 23. The conductive layer 86c is electrically connected to the FPC 77 through an opening in the insulating layer 33, the insulating layer 34, and the insulating layer 35.

As described in this embodiment, in the flexible device of one embodiment of the present invention, the fabrication process of the transistor can be performed at a low temperature because an oxide semiconductor is used for the transistor. Furthermore, the resin layer can have a small thickness and low heat resistance. Therefore, the display device can be light-weight and thin. The display device can have higher flexibility. Warpage of the flexible device due to the thickness of the resin layer can be suppressed in some cases.

This embodiment can be combined with any of the other embodiments as appropriate.

Embodiment 3

In this embodiment, a display module and electronic devices of one embodiment of the present invention will be described with reference to FIG. 20 and FIGS. 21A to 21F.

Figure 20:
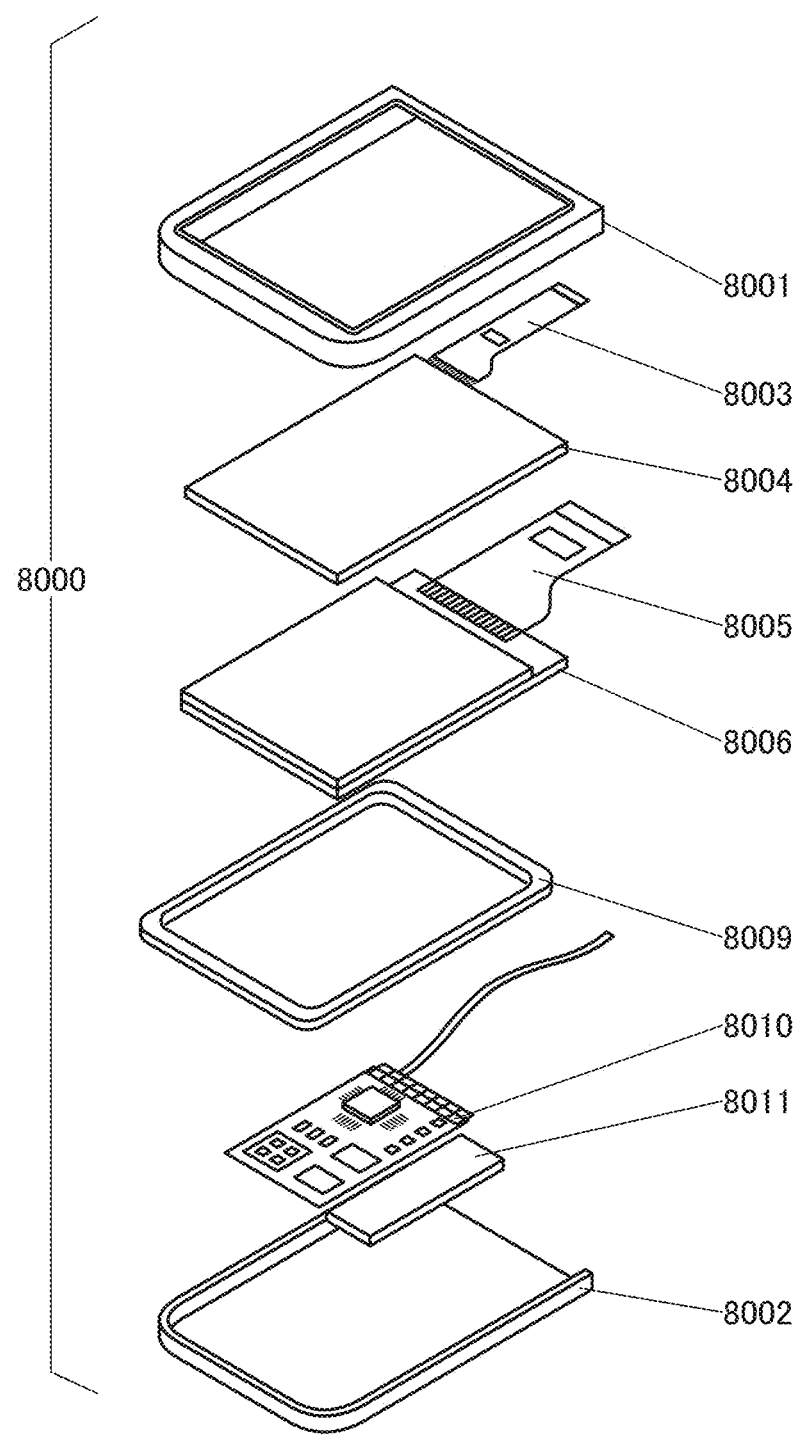
FIG. 20 illustrates an example of a display module.

In a display module 8000 in FIG. 20, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. Instead of providing the touch panel 8004, the display panel 8006 can have a touch panel function.

The frame 8009 protects the display panel 8006 and also functions as an electromagnetic shield for blocking electromagnetic waves generated by the operation of the printed circuit board 8010. The frame 8009 may function as a radiator plate.

The printed circuit board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

Highly reliable electronic devices with curved surfaces can be fabricated by one embodiment of the present invention. In addition, flexible and highly reliable electronic devices can be fabricated by one embodiment of the present invention.

Examples of electronic devices include a television set, a desktop or notebook personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device of one embodiment of the present invention can be incorporated along a curved inside/outside wall surface of a house or a building or a curved interior/exterior surface of a car.

Furthermore, the electronic device of one embodiment of the present invention may include a secondary battery. Preferably, the secondary battery is capable of being charged by contactless power transmission.

Examples of the secondary battery include a lithium-ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays).

The electronic device of one embodiment of the present invention can have a variety of functions, for example, a function of displaying a variety of information (e.g., a still image, a moving image, and a text image) on a display portion, a touch panel function, a function of displaying a calendar, date, time, and the like, a function of executing a variety of software (programs), a wireless communication function, and a function of reading a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of taking a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic device of one embodiment of the present invention are not limited thereto, and the electronic devices can have a variety of functions.

Figure 21A:
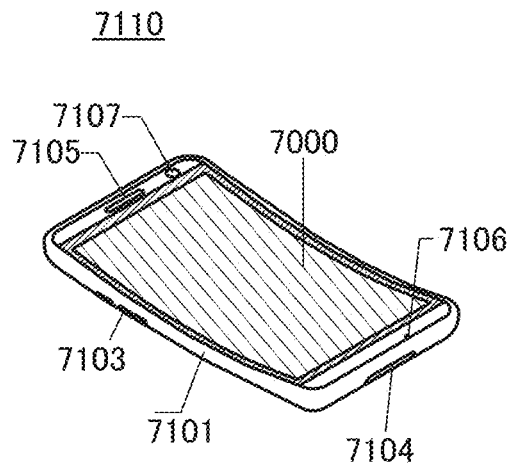
FIGS. 21A to 21F each illustrate an example of an electronic device.
Figure 21B:
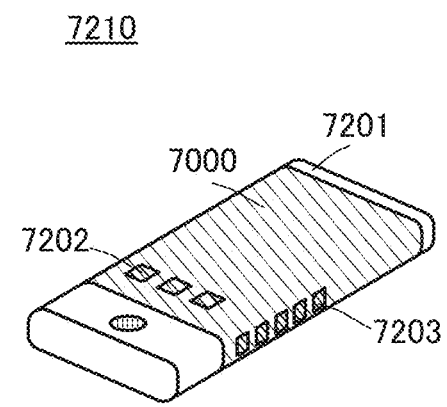
Figure 21C:
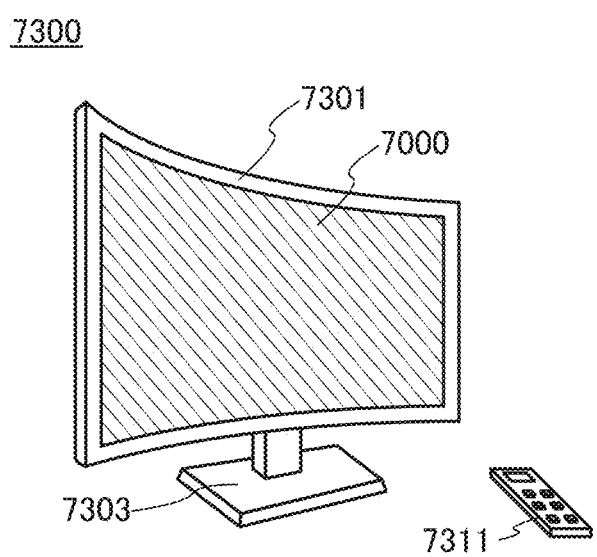

FIGS. 21A to 21C illustrate examples of an electronic device including a display portion 7000 with a curved surface. The display surface of the display portion 7000 is bent, and images can be displayed on the bent display surface. The display portion 7000 may have flexibility.

The display portion 7000 can be formed using the display device of one embodiment of the present invention. One embodiment of the present invention makes it possible to provide a highly reliable electronic device having a curved display portion.

FIG. 21A illustrates an example of a mobile phone. A mobile phone 7110 illustrated in FIG. 21A includes a housing 7101, the display portion 7000, operation buttons 7103, an external connection port 7104, a speaker 7105, a microphone 7106, a camera 7107, and the like.

The mobile phone 7110 includes a touch sensor in the display portion 7000. Operations such as making a call and inputting text can be performed by touch on the display portion 7000 with a finger, a stylus, or the like.

With the operation buttons 7103, power can be on or off. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

FIG. 21B illustrates an example of a portable information terminal. A portable information terminal 7210 illustrated in FIG. 21B includes a housing 7201 and the display portion 7000. The portable information terminal 7210 may also include an operation button, an external connection port, a speaker, a microphone, an antenna, a camera, a battery, or the like. The display portion 7000 is provided with a touch sensor. The operation of the portable information terminal can be performed by touching the display portion 7000 with a finger, a stylus, or the like.

The portable information terminal illustrated in this embodiment functions as, for example, one or more of a telephone set, a notebook, and an information browsing system. Specifically, the portable information terminals each can be used as a smartphone. The portable information terminal illustrated in this embodiment is capable of executing, for example, a variety of applications such as mobile phone calls, e-mailing, reading and editing texts, music reproduction, Internet communication, and a computer game.

The portable information terminal 7210 can display characters, image information, and the like on its plurality of surfaces. For example, three operation buttons 7202 can be displayed on one surface, and information 7203 indicated by a rectangle can be displayed on another surface. FIG. 21B illustrates an example in which the operation buttons 7202 are displayed at the top of the portable information terminal 7210 and the information 7203 is displayed on the side of the portable information terminal 7210. Note that the operation buttons 7202 may be displayed on the side of the portable information terminal 7210 and the information 7203 may be displayed at the top of the portable information terminal 7210, for example. Information may be displayed on three or more surfaces of the portable information terminal 7210.

Examples of the information 7203 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information 7203.

FIG. 21C illustrates an example of a television set. In a television set 7300, the display portion 7000 is incorporated into a housing 7301. Here, the housing 7301 is supported by a stand 7303.

The television set 7300 illustrated in FIG. 21C can be operated with an operation switch of the housing 7301 or a separate remote controller 7311. The display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 21D:
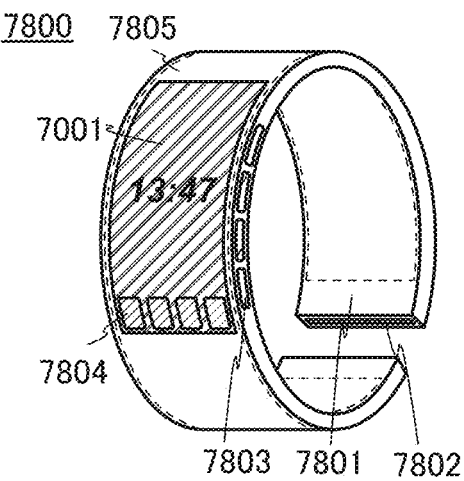
Figure 21E:
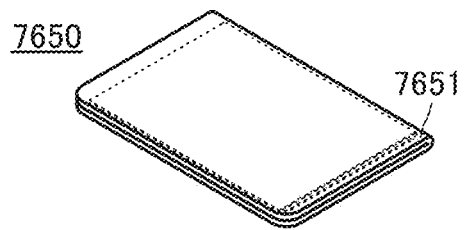
Figure 21F:
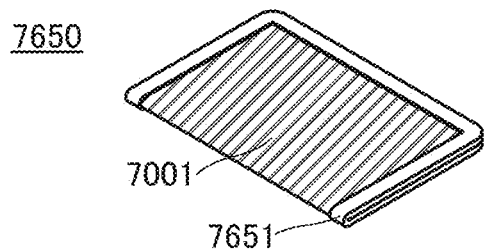

FIGS. 21D to 21F each illustrate an example of a portable information terminal including a flexible and bendable display portion 7001.

The display portion 7001 is fabricated using the display device of one embodiment of the present invention. For example, a display device that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

FIG. 21D illustrates an example of a wrist-watch-type portable information terminal. A portable information terminal 7800 includes a band 7801, the display portion 7001, an input/output terminal 7802, operation buttons 7803, and the like. The band 7801 functions as a housing. A flexible battery 7805 can be included in the portable information terminal 7800. The battery 7805 may be arranged to overlap with the display portion 7001, or the band 7801 and the like, for example.

The band 7801, the display portion 7001, and the battery 7805 have flexibility. Thus, the portable information terminal 7800 can be easily curved to have a desired shape.

With the operation buttons 7803, a variety of functions such as time setting, turning on or off of the power, turning on or off of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, an application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

FIGS. 21E and 21F illustrate an example of a foldable portable information terminal. FIG. 21E illustrates a portable information terminal 7650 that is folded so that the display portion 7001 is on the inside. FIG. 21F illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged. Note that although FIGS. 21E and 21F illustrate an example of the portable information terminal 7650 that is folded in two, the portable information terminal 7650 may be folded in three, four, or more. The portable information terminal 7650 may include an operation button, an external connection port, a speaker, a microphone, an antenna, a camera, a battery, or the like.

This embodiment can be combined with any of the other embodiments as appropriate.

Example 1

In this example, results of peeling a formation substrate from a process member by a peeling method of one embodiment of the present invention will be described.

Figure 22:
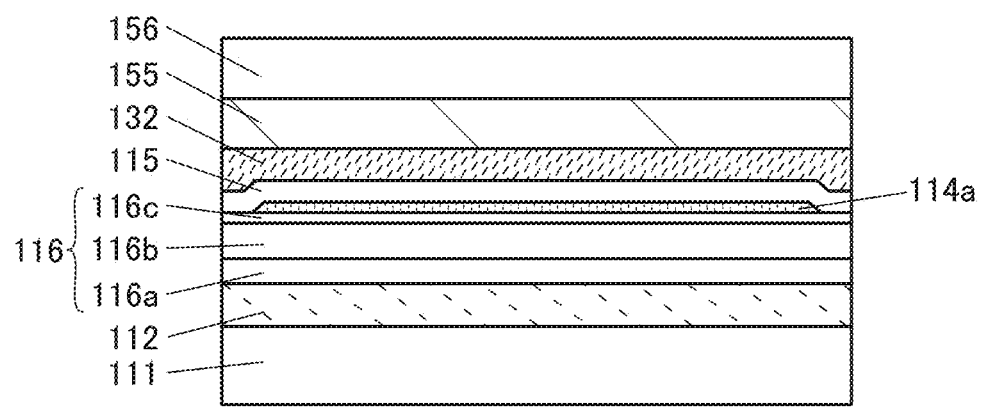
FIG. 22 illustrates a process member of Example 1.

FIG. 22 is a cross-sectional schematic view of a process member 500. Materials used for the process member 500 are as follows. Note that an oxide semiconductor layer used as a semiconductor layer of a transistor and an insulating layer used as a gate insulating layer are formed over a resin layer on the assumption that the transistor is separated from a formation substrate in the process member 500.

As the formation substrate 111, an approximately 0.7-mm-thick glass substrate was used. As the resin layer 112, an approximately 1.55-μm-thick polyimide resin film was used. As an insulating layer 116, a stack of an approximately 200-nm-thick silicon oxynitride film 116a, an approximately 400-nm-thick silicon nitride film 116b, and an approximately 50-nm-thick silicon oxynitride film 116c was used. As an oxide semiconductor layer 114a, an approximately 40-nm-thick In—Ga—Zn oxide film was used. As an insulating layer 115, an approximately 150-nm-thick silicon oxynitride film was used. As the bonding layer 132, an approximately 5-μm-thick thermosetting epoxy resin film was used. As a flexible substrate 155, an approximately 23-μm-thick film was used. As a protective film 156, an approximately 100-μm-thick film was used.

Note that a polyimide resin film was formed using a photosensitive and thermosetting material having a viscosity of approximately 30 cP.

Next, a step of peeling the formation substrate 111 from the process member 500 will be described.

The process member 500 was irradiated with laser light from the formation substrate 111 side. In a top view, the entire surface of the process member 500 was irradiated with the laser light. Note that a shielding mask was provided in the peripheral portion of the process member 500 in irradiation.

As a laser emitting laser light, a XeCl excimer laser with a wavelength of 308 nm was used. The energy, repetition rate, and scan rate of the oscillator were set to 980 mJ, 60 Hz, and 11.7 mm/second, respectively. The cross section of the laser light is shaped into a linear form with a size of 0.6 mm×300 mm by adjusting an optical system. An attenuator was used for the optical system. Irradiation energy attenuation by the attenuator was 10%.

After the laser light irradiation, the inner side than the peripheral portion of the process member 500 was cut by a cutter from the protective film 156 side, so that the formation substrate 111 was peeled from the process member 500.

Figure 23A:
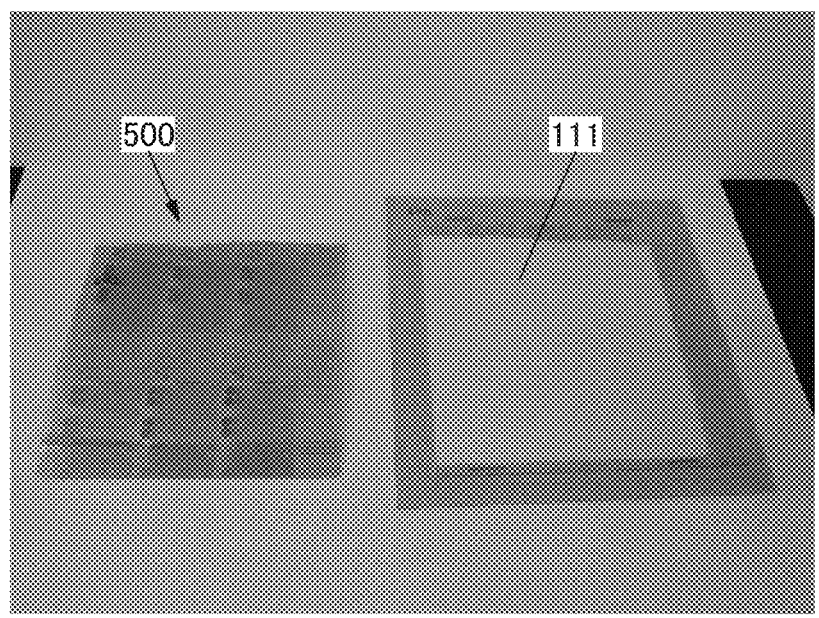
FIGS. 23A and 23B are photographs showing results of Example 1.
Figure 23B:
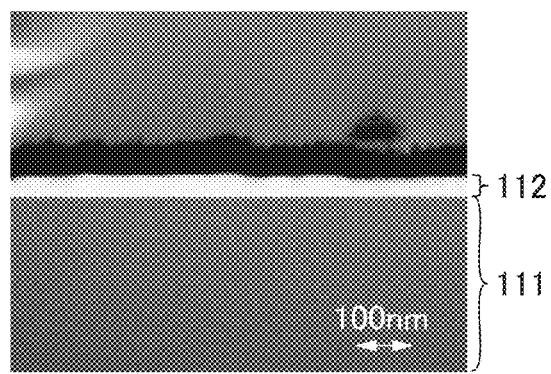

FIG. 23A is a photograph showing the appearances of the process member 500 from which the formation substrate 111 was peeled and the peeled formation substrate 111. FIG. 23B is a STEM photograph of a cross section around the surface of the peeled formation substrate 111. According to FIG. 23B, it is found that the approximately 50-nm-thick resin layer 112 remains over the peeled formation substrate 111.

According to FIGS. 23A and 23B, it is found that the formation substrate can be peeled at an interface which is around the boundary between the formation substrate and the resin layer by the peeling method of one embodiment of the present invention.

Example 2

In this example, results of thermal desorption spectroscopy (TDS) analysis of samples fabricated in order to examine release of water from a polyimide resin layer used for one embodiment of the present invention will be described.

The samples used in the TDS analysis are nine samples, Samples A1, A2, A3, B1, B2, B3, C1, C2, and C3, the fabrication methods of which will be described below.

First, in all of the nine samples, an approximately 1.55-μm-thick polyimide resin layer 812 was formed over a glass substrate 811. Heat treatment in a nitrogen atmosphere for one hour was performed to form the polyimide resin layer 812. The temperature of the heat treatment was different in each sample as follows. That is, the heat treatment was performed at 350° C. in Samples A1, B1, and C1, 400° C. in Samples A2, B2, and C2, and 450° C. in Samples A3, B3, and C3.

Next, in each of Samples B1 to B3 and C1 to C3, an approximately 200-nm-thick silicon oxynitride film 813a was formed over the polyimide resin layer 812. Then, in each of Samples C1 to C3, an approximately 400-nm-thick silicon nitride film 813b and an approximately 50-nm-thick silicon oxynitride film 813c were formed in this order over the silicon oxynitride film 813a.

Figure 24A:
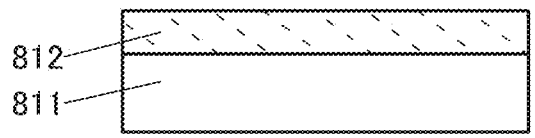
FIGS. 24A to 24C each illustrate a sample of Example 2.
Figure 24B:
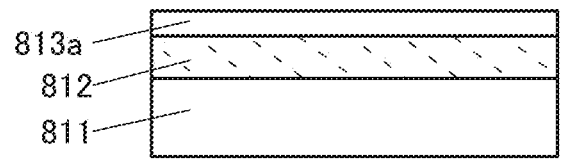
Figure 24C:
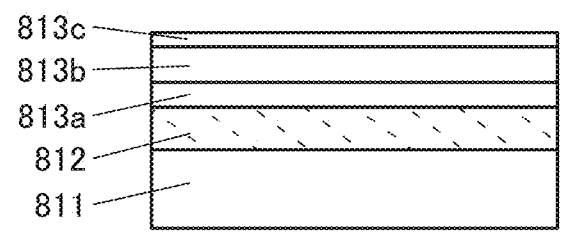

In this manner, the nine samples were fabricated. FIGS. 24A to 24C are cross-sectional schematic views of the samples.

Figure 25A:
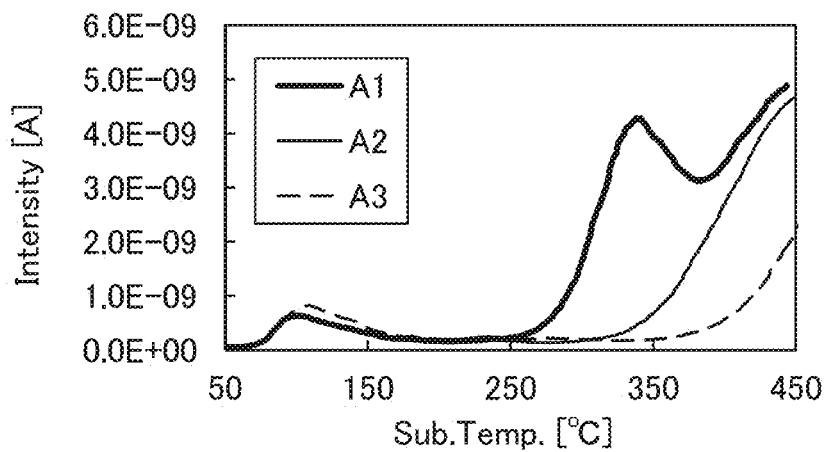
FIGS. 25A to 25C show TDS analysis results of Example 2.
Figure 25B:
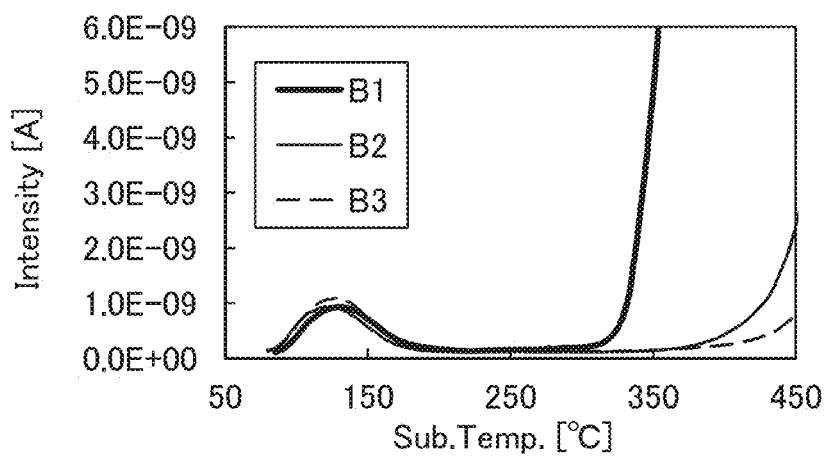
Figure 25C:
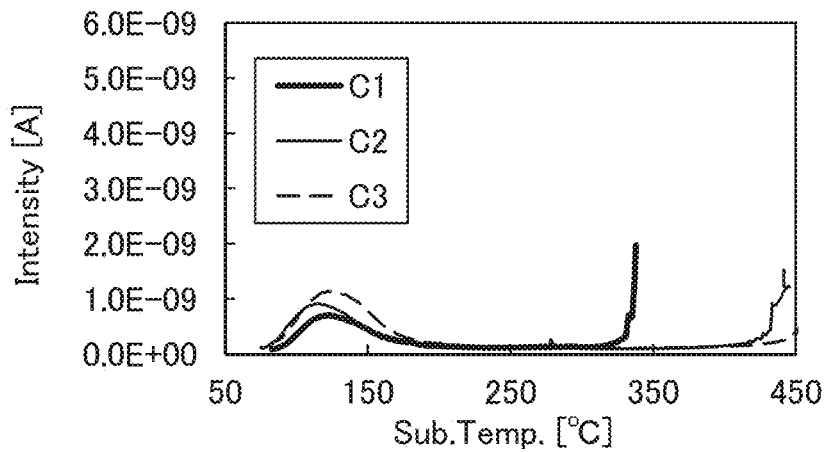

FIGS. 25A to 25C show the results of TDS analyses performed on the above nine samples. FIG. 25A, FIG. 25B, and FIG. 25C are the results of TDS analyses performed on Samples A1 to A3, Samples B1 to B3, and Samples C1 to C3, respectively. Note that in each of the TDS analyses, the amount of a released gas with a mass-to-charge ratio m/z=18, which corresponds to a water molecule, was measured. In each of FIGS. 25A to 25C, the horizontal axis represents substrate heating temperature [° C.] and the vertical axis represents intensity proportional to the amount of the released gas with m/z=18.

According to FIG. 25A, for example, in the case where the formation temperature of a transistor including an oxide semiconductor was below 350° C. when the polyimide resin layer 812 was heated at a temperature higher than or equal to 400° C. in formation, it is found that release of water can be suppressed. Furthermore, according to FIGS. 25B and 25C, in a structure in which an inorganic film was provided over the polyimide resin layer 812, when the polyimide resin layer 812 is heated at a temperature higher than or equal to 400° C. in formation, it is found that release of moisture below 400° C. can be suppressed.

As described above, according to the results of this example, in the case where the transistor including an oxide semiconductor was formed over the polyimide resin layer, when the polyimide resin layer was heated at a temperature higher than or equal to 400° C. in formation, it is found that release of moisture from the polyimide resin layer can be suppressed. The above suggests that variation in electrical characteristics of the transistor due to release of water from the polyimide resin layer can be suppressed.

Example 3

In this example, results of comparing electrical characteristics of a transistor before and after peeling from a formation substrate will be described. Note that the transistor is formed over the formation substrate with a resin layer provided therebetween. The peeling method of the formation substrate is similar to that described in Example 1.

The structure of the transistor fabricated in this example is similar to the transistor 80 in FIG. 12A and the like.

As the formation substrate 14, an approximately 0.7-mm-thick glass substrate was used. As the resin layer 23, an approximately 1.55-μm-thick polyimide resin film was used. As the insulating layer 31, an approximately 200-nm-thick silicon oxynitride film was used. As the conductive layer 81 functioning as a back gate electrode of the transistor, an approximately 100-nm-thick titanium film was used. As the insulating layer 82, a stack of an approximately 400-nm-thick silicon nitride film and an approximately 50-nm-thick silicon oxynitride film was used. As the oxide semiconductor layer 83, an approximately 40-nm-thick In-Ga—Zn oxide semiconductor film formed using an oxide target with an atomic ratio where In:Ga:Zn=4:2:3 was used. As the insulating layer 84, an approximately 150-nm-thick silicon oxynitride film was used. As the conductive layer 85 functioning as a gate electrode of the transistor, an approximately 100-nm-thick In-Ga—Zn oxide film formed using an oxide target with an atomic ratio where In:Ga:Zn=4:2:3 was used. As the insulating layer 33, a stack of an approximately 100-nm-thick silicon nitride film and an approximately 300-nm-thick silicon oxynitride film was used. As the conductive layers 86a and 86b, a stack of an approximately 10-nm-thick titanium film and an approximately 100-nm-thick copper film was used. As the insulating layer 34, an approximately 1.5-μm-thick acrylic resin film was used.

The $I_d$-$V_g$ characteristics (drain current-gate voltage characteristics) of the above transistor were measured. The measurement conditions were different as follows before and after peeling of the formation substrate. Before the peeling, the $I_d$-$V_g$ characteristics were measured in such a manner that the drain voltage was set to 0.1 V or 20 V and the back gate voltage and the gate voltage were swept from ~8 V to 8 V in increments of 0.25 V. After the peeling, the $I_d$-$V_g$ characteristics were measured in such a manner that the drain voltage was set to 0.1 V or 10 V and the back gate voltage and the gate voltage were swept from ~8 V to 8 V in increments of 0.25 V.

Figure 26A:
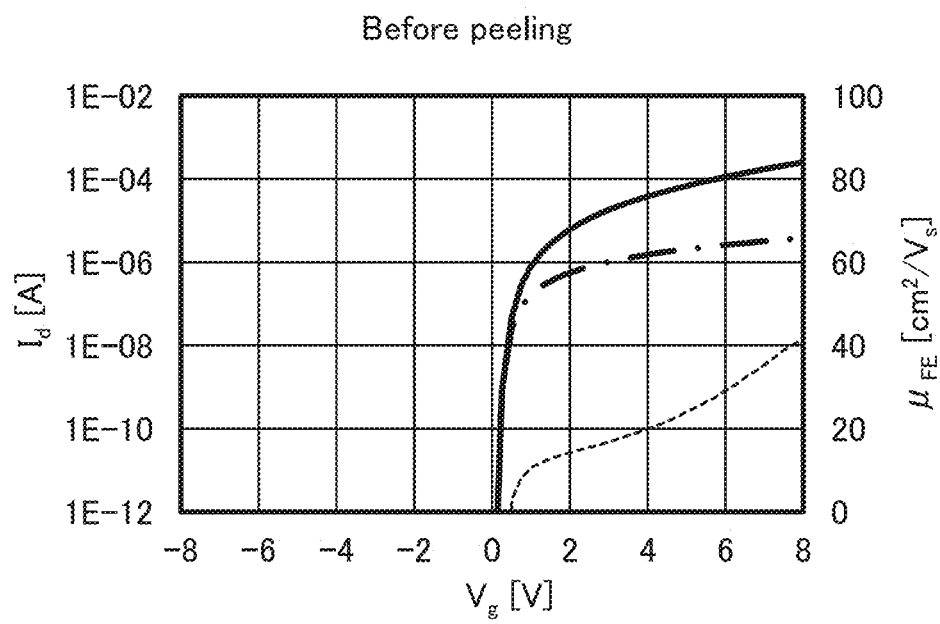
FIGS. 26A and 26B each show $I_d$-$V_g$ characteristics of a transistor of Example 3.
Figure 26B:
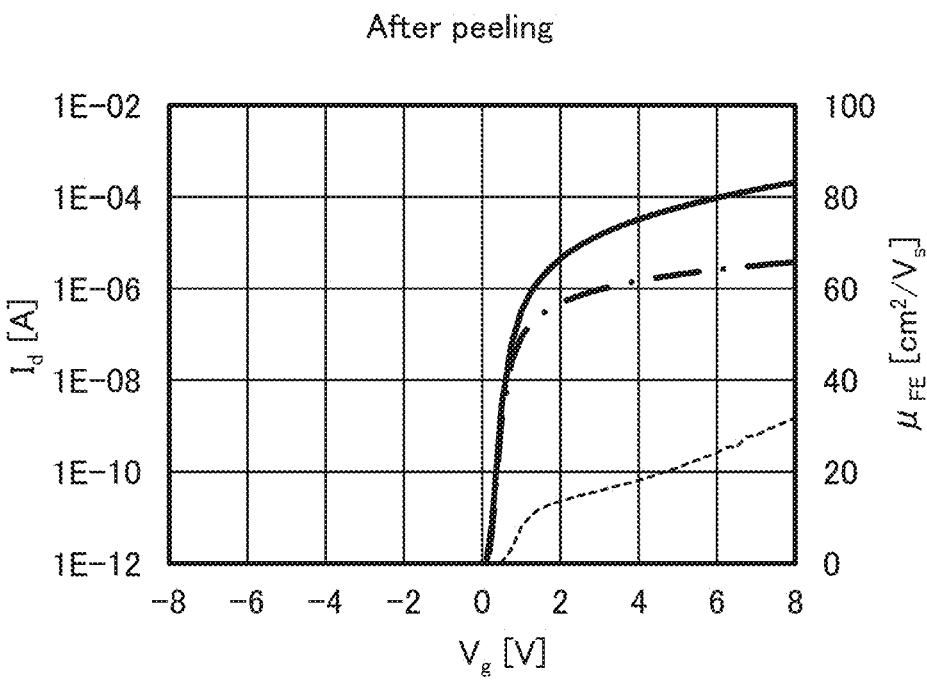

Measurement results of $I_d$-$V_g$ characteristics are shown in FIGS. 26A and 26B and FIGS. 27A and 27B. FIGS. 26A and 26B show the measurement results of transistors before and after peeling each having a channel length L of 3 μm and a channel width W of 50 μm. FIGS. 27A and 27B show the measurement results of transistors before and after peeling each having a channel length L of 6 μm and a channel width W of 50 μm. In FIGS. 26A and 26B and FIGS. 27A and 27B, the horizontal axis represents gate voltage $V_g$ [V], the left vertical axis represents drain current $I_d$ [A], and the right vertical axis represents field-effect mobility $\mu_{FE}$ [cm$^2$/V$_s$]. In addition, in FIGS. 26A and 26B and FIGS. 27A and 27B, a thick solid line indicates $I_d$-$V_g$ characteristics at a drain voltage of 10 V or 20 V, a thick dashed-dotted line indicates $I_d$-$V_g$ characteristics at a drain voltage of 0.1 V, and a thin dashed line indicates field-effect mobility $\mu_{FE}$ at a drain voltage of 10 V or 20 V. The transistors measured before and after peeling are different transistors formed over the same resin layer 23.

As shown in FIGS. 26A and 26B and FIGS. 27A and 27B, it is found that there is little difference between the electrical characteristics of the transistors formed over the resin layer before and after peeling of the formation substrate from the resin layer.

According to this example, the above suggests that the use of the peeling method of one embodiment of the present invention allows the formation substrate to be peeled from the resin layer without influencing the electrical characteristics of the transistors provided over the resin layer.

Example 4

Items shown in Table 1 in the peeling method of one embodiment of the present invention will be described below in detail.

unnecessary portion can be removed with an organic solvent such as thinner. Depending on the material of the resin layer, turbidity, gelation, or solidification might occur by reaction with thinner. The material of the resin layer used in Example 1 and the like is dissolved in an organic solvent such as thinner; therefore, the unnecessary portion can be easily removed before curing the resin layer.

The photosensitive material is preferably used because the resin layer can be easily processed. The resin layer can be processed by applying the material and then performing light exposure and development. The fabrication process can be shortened because a resist mask is not needed.

In the case of using the nonphotosensitive material, a resist mask is formed as follows: the material is applied and cured by heating, a resist is applied to the resin layer, and then light exposure and development are performed. After that, the resin layer can be processed by dry etching.

It is preferable that a fabrication apparatus easily read an alignment marker in a step of forming a layer to be peeled (e.g., a transistor or a display element) over the resin layer and a step of attaching a substrate to the resin layer. The nonphotosensitive material has in some cases a higher visible-light transmitting property than the photosensitive material. The resin layer having a high visible-light transmitting property is preferable because a fabrication apparatus can easily recognize the marker and the degree of freedom of the layout is increased as compared with a colored resin layer.

TABLE 1

| Processing on formation substrate | Not performed | | | |
|---|---|---|---|---|
| Material of resin layer | Photosensitive material including polyimide resin precursor | | Nonphotosensitive material including soluble polyimide resin | |
| Heat condition of resin layer | Baking in N$_2$ atmosphere at 350° C. | | Baking in N$_2$ atmosphere at 350° C. | |
| Ease of removing resin layer before curing | ○ | | ○ | |
| Processability of resin layer | ○ Removal by light exposure | | Δ Removal by etching | |
| Marker recognition | Δ | | ○ | |
| Removal of resin layer after peeling | Performed | Not performed | Performed | Not performed |
| Method for forming contact with through electrode | (a) Exposing through electrode by removing resin layer by ashing after peeling | (b) Exposing through electrode after peeling step by forming opening in resin layer in formation and forming through electorde (forming opening by light exposure) | Refer to (a) | Refer to (b) (opening is formed with resist mask) |
| Finishing coloring | ◉ Non-colored | X Colored | ◉ Non-colored | ◉ Non-colored |
| Peelability | ◉ | ◉ | ◉ | ◉ |

As described in Example 1 and the like, particular processing such as plasma treatment on the formation substrate is not necessary. As the material of the resin layer, a photosensitive material including a polyimide resin precursor is favorable. Alternatively, as the material of the resin layer, a nonphotosensitive material including a soluble polyimide resin is favorable. As the heat condition to form the resin layer, baking in an N$_2$ atmosphere at 350° C. is favorable.

Here, when the material of the resin layer is applied to the formation substrate, the material might be non-uniformly applied to part of the peripheral portion of the substrate or the like. It is preferable to remove such an unnecessary portion easily before curing the resin layer. For example, the In the case of removing the resin layer after peeling, a through electrode can be exposed. The resin layer is preferably removed by ashing. In the case of using ashing, dry etching, or the like, the shape of an opening of the resin layer is close to a perpendicular shape. Since the resin layer is removed, the finishing device is not affected by the color of the resin layer.

In the case of not removing the resin layer after peeling, the through electrode is preferably exposed by peeling. When the resin layer is formed, an opening is formed in the resin layer to form the through electrode in the opening. In the case of using the photosensitive material, an opening can be formed in the resin layer by light-exposure technique. At this time, the opening has a tapered shape. In the case of using the nonphotosensitive material, an opening can be formed in the resin layer with a resist mask. At this time, the shape of the opening is close to a perpendicular shape. Then, the resin layer and the through electrode are exposed by peeling. Note that a material having low adhesion to the formation substrate is preferably used for the through electrode. In addition, a contact area with the through electrode and the formation substrate is preferably as small as possible. Since the resin layer is not removed, the finishing device is affected by the color of the resin layer. In the case of using a colored resin, the resin layer is preferably not provided in an unnecessary portion to suppress a decrease in light extraction efficiency. The resin layer having a high visible-light transmitting property is preferably used because light extraction efficiency is less likely to decrease even when the resin layer is left.

Both materials are comparably preferable in terms of ease of peeling.

This application is based on Japanese Patent Application serial no. 2016-077668 filed with Japan Patent Office on Apr. 7, 2016 and Japanese Patent Application serial no. 2016-077667 filed with Japan Patent Office on Apr. 7, 2016, the entire contents of which are hereby incorporated by reference.

What is claimed is:

1. A display device comprising:
a first resin layer over a substrate;
a second resin layer over the first resin layer;
a first insulating layer over the second resin layer;
a first gate electrode over the first resin layer;
an oxide semiconductor layer over the first gate electrode;
a gate insulating layer over the oxide semiconductor layer;
a second gate electrode over the gate insulating layer;
a second insulating layer over the oxide semiconductor layer;
a source electrode in contact with the oxide semiconductor layer through a first opening of the second insulating layer;
a drain electrode in contact with the oxide semiconductor layer through a second opening of the second insulating layer;
a third insulating layer over the source electrode and the drain electrode;
a first conductive layer over the third insulating layer, the first conductive layer functioning as a pixel electrode of a light-emitting element;
a fourth insulating layer covering an edge portion of the first conductive layer;
an EL layer of the light-emitting element, over the first conductive layer and the fourth insulating layer;
a second conductive layer of the light-emitting element, over the EL layer;
a third conductive layer over the second insulating layer; and
a fourth conductive layer over the first resin layer, the fourth conductive layer being electrically connected to the third conductive layer,
wherein one of the first opening and the second opening overlaps with the light-emitting element,
wherein the third conductive layer has a region positioned inside a third opening of the second insulating layer, and
wherein the fourth conductive layer has a region in contact with a bottom surface of the third conductive layer.

2. The display device according to claim 1,
wherein the first gate electrode and the second gate electrode comprise molybdenum, and
wherein the source electrode and the drain electrode comprise titanium.

3. The display device according to claim 1,
wherein the first resin layer and the second resin layer comprise polyimide resin.

4. A display device comprising:
a first resin layer over a substrate;
a second resin layer over the first resin layer;
a first insulating layer over the second resin layer;
a first gate electrode over the first resin layer;
an oxide semiconductor layer over the first gate electrode;
a gate insulating layer over the oxide semiconductor layer;
a second gate electrode over the gate insulating layer;
a second insulating layer over the oxide semiconductor layer;
a source electrode in contact with the oxide semiconductor layer through a first opening of the second insulating layer;
a drain electrode in contact with the oxide semiconductor layer through a second opening of the second insulating layer;
a third insulating layer over the source electrode and the drain electrode;
a first conductive layer over the third insulating layer, the first conductive layer functioning as a pixel electrode of a light-emitting element;
a fourth insulating layer covering an edge portion of the first conductive layer;
an EL layer of the light-emitting element, over the first conductive layer and the fourth insulating layer;
a second conductive layer of the light-emitting element, over the EL layer;
a third conductive layer over the second insulating layer; and
a fourth conductive layer over the first resin layer, the fourth conductive layer being electrically connected to the third conductive layer,
wherein one of the first opening and the second opening overlaps with the light-emitting element,
wherein the third conductive layer has a region positioned inside a third opening of the second insulating layer,
wherein the fourth conductive layer has a region in contact with a bottom surface of the third conductive layer, and
wherein a width of the first gate electrode is larger than a width of the second gate electrode in a channel length direction.

5. The display device according to claim 4,
wherein the first gate electrode and the second gate electrode comprise molybdenum, and
wherein the source electrode and the drain electrode comprise titanium.

6. The display device according to claim 4,
wherein the first resin layer and the second resin layer comprise polyimide resin.

* * * * *